United States Patent
Arai et al.

(10) Patent No.: US 8,357,013 B2
(45) Date of Patent: Jan. 22, 2013

(54) REDUCING FAR-END CROSSTALK IN ELECTRICAL CONNECTORS

(75) Inventors: Tatsuya Arai, Los Altos, CA (US); Ching-Chao Huang, San Jose, CA (US); Clement Kam Lam Luk, Kowloon (HK); Jeremy Buan, San Jose, CA (US); Tsutomu Matsuo, Cupertino, CA (US); Toshiyuki Takada, Cupertino, CA (US); Masakazu Nagata, Cupertino, CA (US)

(73) Assignee: Hirose Electric Co., Ltd., Tokyo (JP)

( * ) Notice: Subject to any disclaimer, the term of this patent is extended or adjusted under 35 U.S.C. 154(b) by 0 days.

(21) Appl. No.: 12/613,501

(22) Filed: Nov. 5, 2009

(65) Prior Publication Data

US 2010/0184307 A1   Jul. 22, 2010

Related U.S. Application Data

(60) Provisional application No. 61/146,614, filed on Jan. 22, 2009.

(51) Int. Cl.
*H01R 24/00* (2011.01)
(52) U.S. Cl. .................. 439/676; 439/941; 379/417
(58) Field of Classification Search .............. 439/941, 439/676; 379/417
See application file for complete search history.

(56) References Cited

U.S. PATENT DOCUMENTS

| | | | |
|---|---|---|---|
| 5,389,735 A * | 2/1995 | Bockelman | 174/33 |
| 5,679,027 A | 10/1997 | Smith | |
| 5,997,358 A | 12/1999 | Adriaenssens | |
| 6,120,330 A | 9/2000 | Gwiazdowski | |
| 6,236,645 B1 | 5/2001 | Agazzi | |
| 6,266,347 B1 | 7/2001 | Amrany | |
| 6,270,381 B1 * | 8/2001 | Adriaenssens et al. | 439/676 |
| 6,285,653 B1 | 9/2001 | Koeman | |
| 7,166,000 B2 * | 1/2007 | Pharney | 439/676 |
| 7,168,993 B2 * | 1/2007 | Hashim | 439/676 |
| 7,172,466 B2 * | 2/2007 | Aekins et al. | 439/676 |
| 7,186,149 B2 * | 3/2007 | Hashim | 439/676 |
| 7,201,618 B2 * | 4/2007 | Ellis et al. | 439/676 |
| 7,204,722 B2 * | 4/2007 | Hashim et al. | 439/676 |
| 7,309,239 B2 * | 12/2007 | Shuey et al. | 439/74 |
| 7,317,318 B2 | 1/2008 | Jackson | |

(Continued)

FOREIGN PATENT DOCUMENTS

| | | | |
|---|---|---|---|
| JP | 2000-101489 A | 4/2000 | |
| JP | 2005-520450 A | 7/2005 | |

(Continued)

OTHER PUBLICATIONS

International Search Report, Korean Intellectual Property Office, Aug. 3, 2010, PCT/US2010/020474.

(Continued)

*Primary Examiner* — Renee Luebke
*Assistant Examiner* — Larisa Tsukerman
(74) *Attorney, Agent, or Firm* — Procopio, Cory, Hargreaves & Savitch LLP

(57) ABSTRACT

The present invention involves connectors for reducing Far-End Crosstalk (FEXT) through the use of novel polarity swapping to negate the cumulative effect of FEXT. Skew adjustment is used to improve the FEXT cancellation from polarity swapping. The polarity reversal location or locations among FEXT sources are optimized to achieve maximum FEXT cancellation. The novelty polarity swapping technique can be applied to a wide variety of connectors, such as mezzanine connectors, backplane connectors, and any other connectors that can benefit from FEXT reduction.

18 Claims, 23 Drawing Sheets

U.S. PATENT DOCUMENTS

| | | | |
|---|---|---|---|
| 7,341,493 B2 * | 3/2008 | Pepe et al. | 439/676 |
| 7,394,752 B2 | 7/2008 | Hasegawa et al. | |
| 7,452,246 B2 | 11/2008 | Caveney et al. | |
| 7,607,951 B2 | 10/2009 | Kirk | |
| 2006/0121791 A1 | 6/2006 | Hashim | |
| 2006/0228912 A1 * | 10/2006 | Morlion et al. | 439/65 |
| 2007/0184725 A1 | 8/2007 | Hashim | |
| 2007/0275607 A1 | 11/2007 | Kwark et al. | |
| 2007/0293094 A1 | 12/2007 | Aekins | |
| 2008/0214029 A1 * | 9/2008 | Lemke et al. | 439/108 |
| 2008/0233806 A1 | 9/2008 | Rothermel et al. | |
| 2008/0293289 A1 | 11/2008 | Siev et al. | |
| 2009/0011624 A1 | 1/2009 | Yamazaki | |
| 2010/0183141 A1 * | 7/2010 | Arai et al. | 379/417 |

FOREIGN PATENT DOCUMENTS

| | | |
|---|---|---|
| JP | 2006-260836 A | 9/2006 |
| WO | 03-084117 A | 10/2003 |

OTHER PUBLICATIONS

International Search Report, Korean Intellectual Property Office, Aug. 20, 2010, PCT/US2010/020338.

B. Young, "Digital Signal Integrity: Modeling and Simulation with Interconnects and Packages", 1st edition, Prentice Hall, ISBN 0-13-028904-3, eq. 2.61, p. 103, 2000.

E. Mensink et al., "Optimal positions of twists in global on-chip differential interconnects", IEEE Transactions on Very Large Scale Integration (VLSI) Systems, vol. 15, Issue 4, pp. 438-446, Apr. 2007.

* cited by examiner

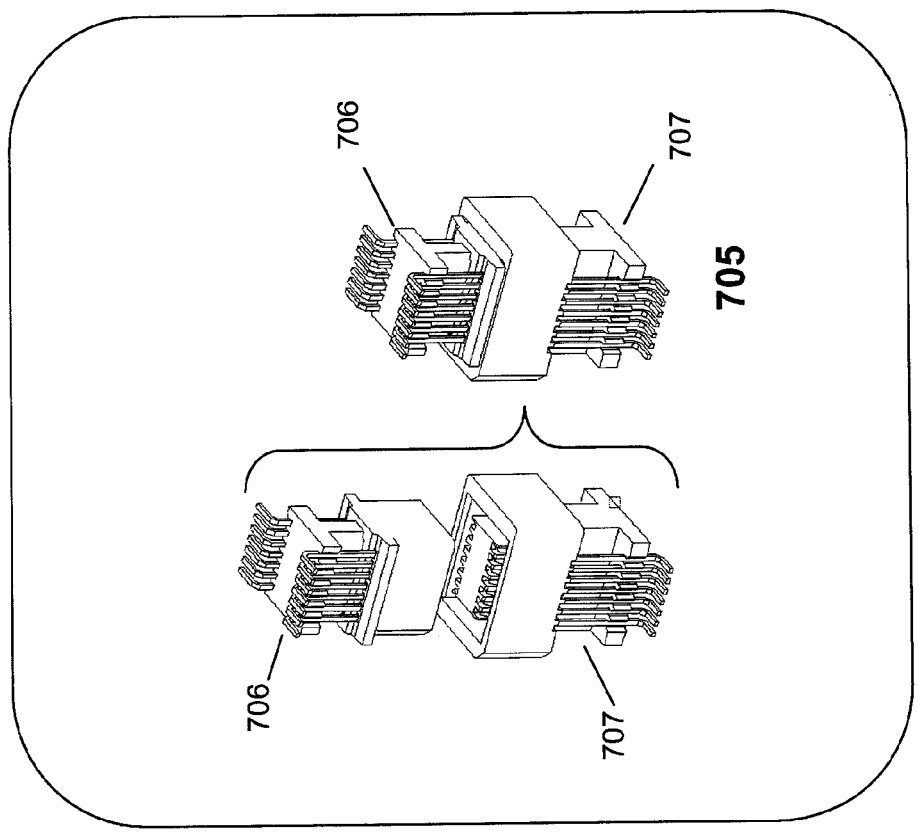
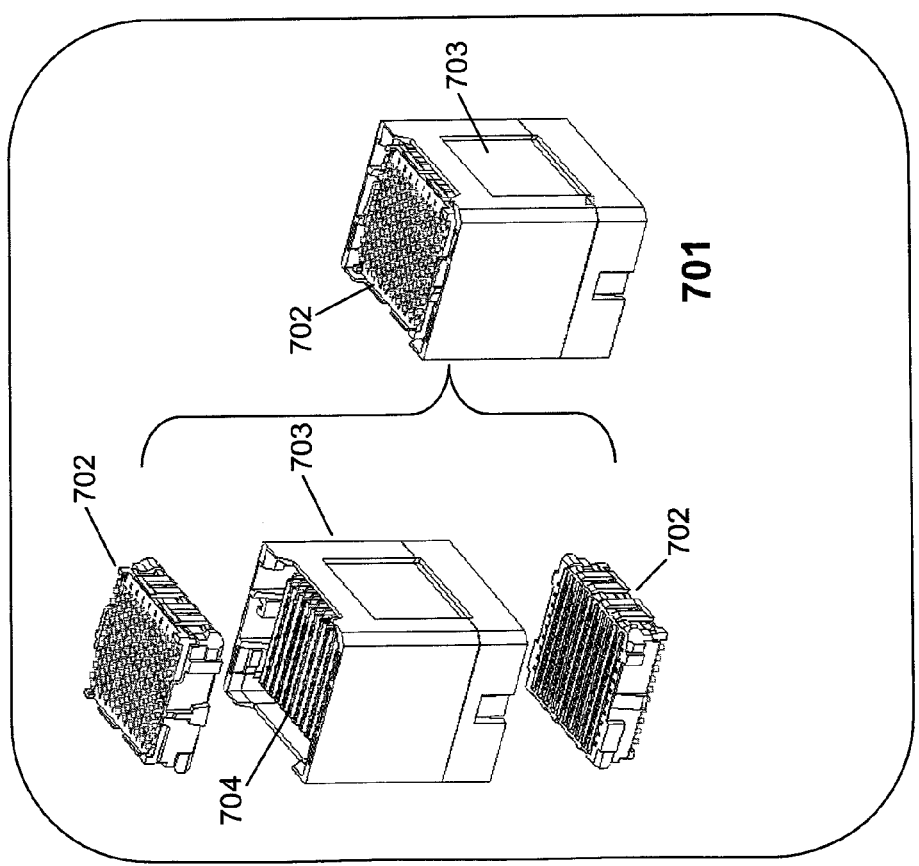
Figure 7a
Figure 7b
Figure 7

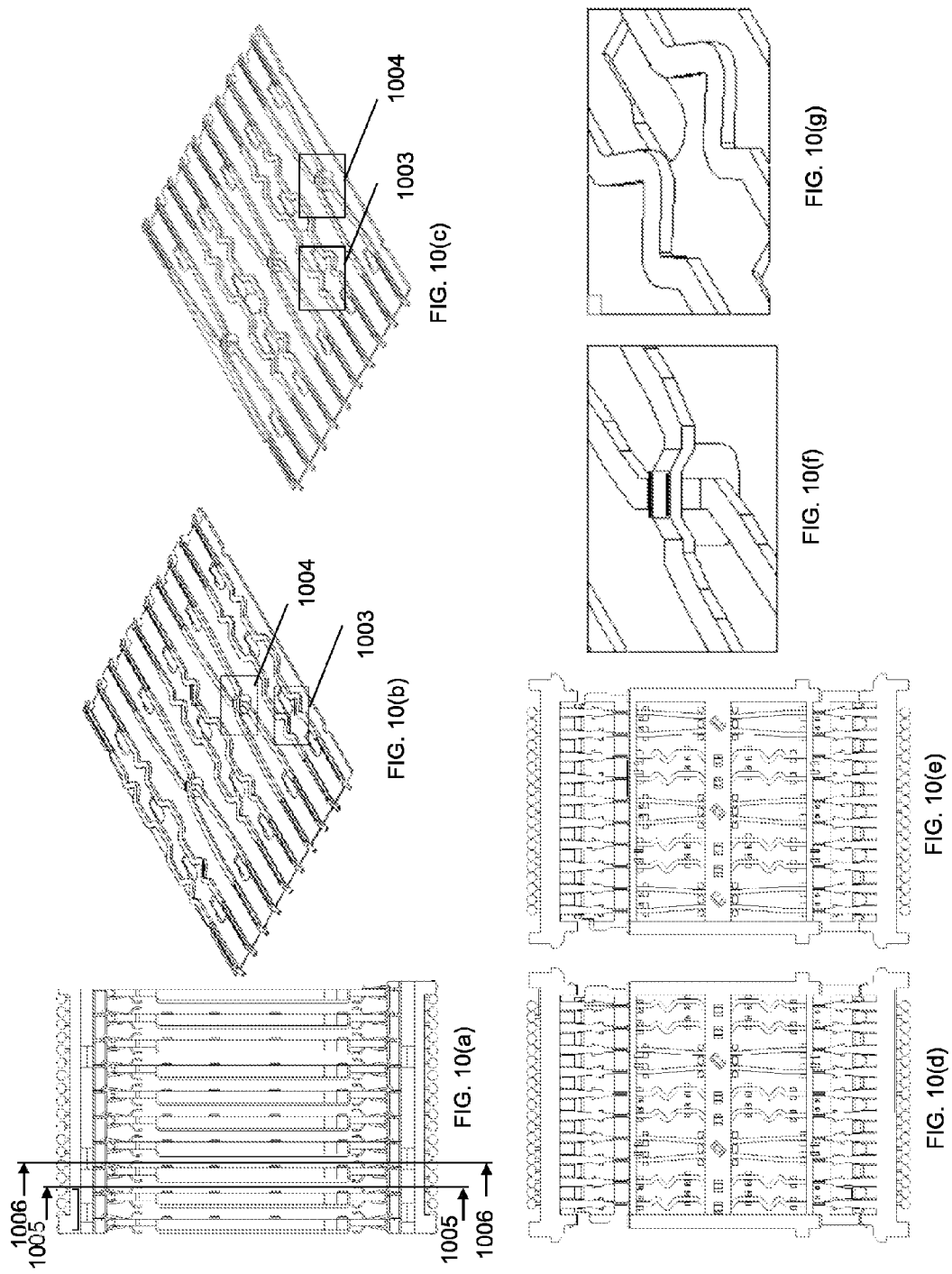

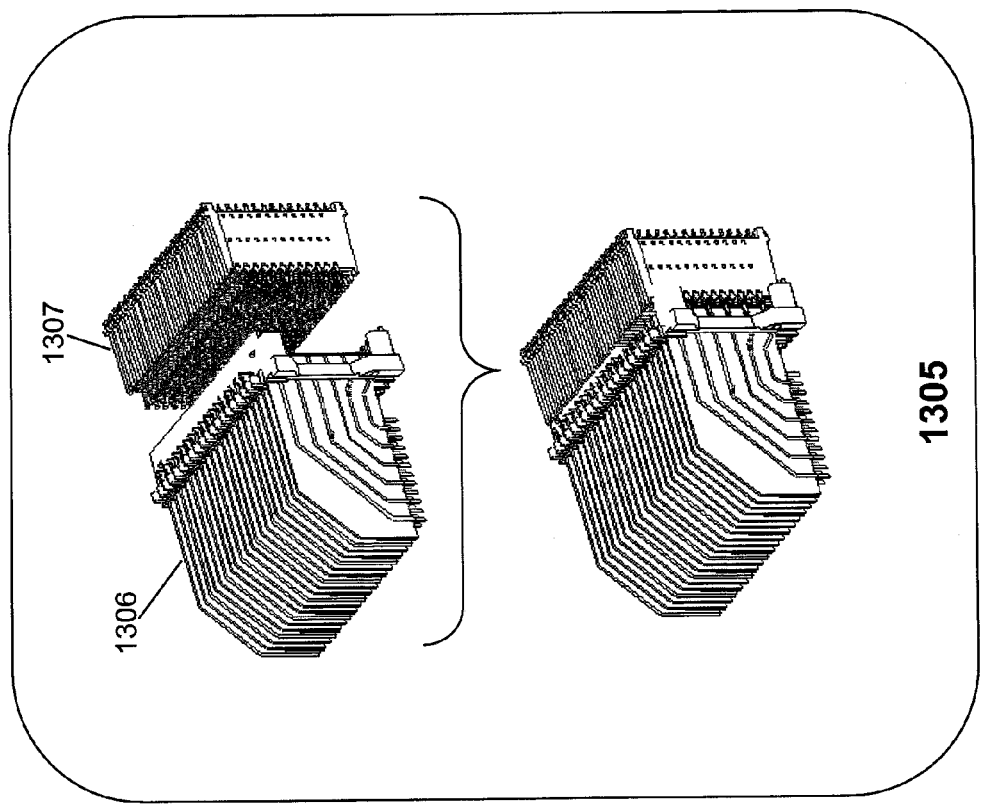
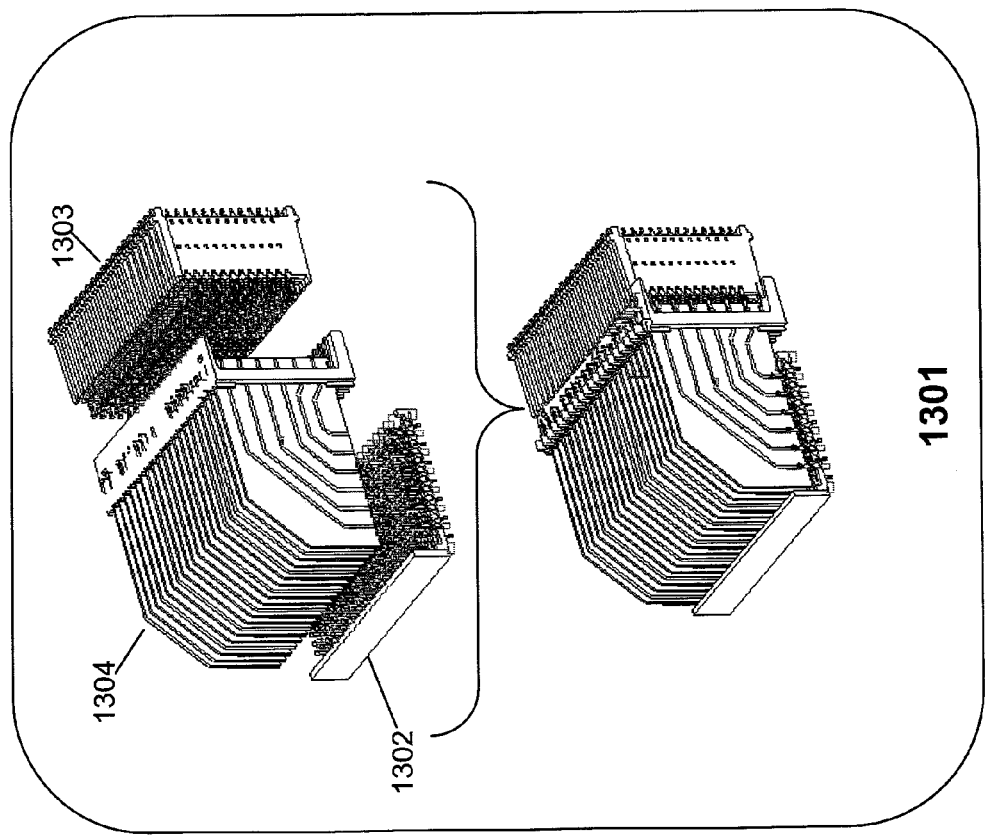
Figure 13

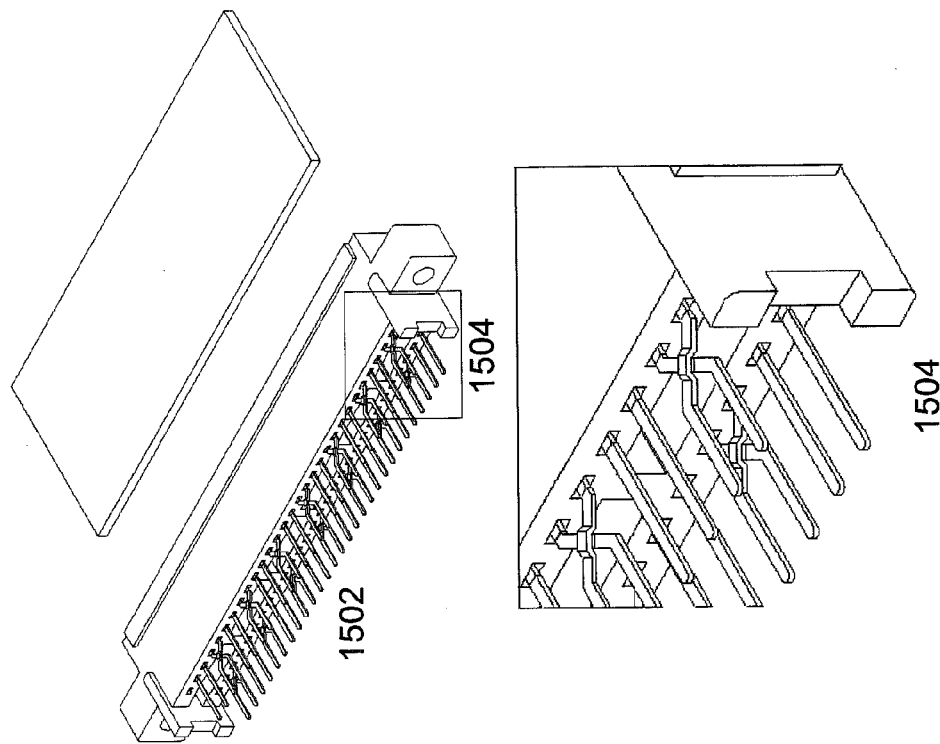
Figure 15b
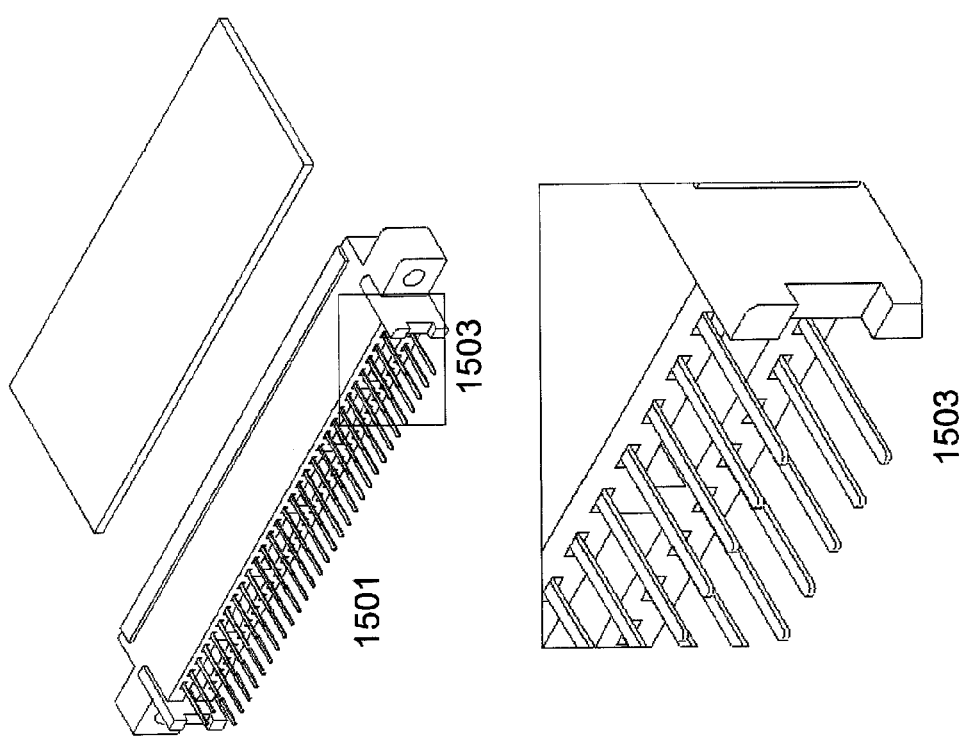
Figure 15a
Figure 15

REDUCING FAR-END CROSSTALK IN ELECTRICAL CONNECTORS

CROSS-REFERENCE TO RELATED APPLICATION

This regular U.S. patent application is based on and claims the benefit of priority under 35 U.S.C. 119 from provisional U.S. patent application No. 61/146,614, filed on Jan. 22, 2009, the entire disclosure of which is incorporated by reference herein.

FIELD OF THE INVENTION

This invention relates in general to systems for reducing Far-End Crosstalk (FEXT) and, more particularly, towards the reduction of FEXT in electrical connectors that are transmitting differential signals and may include both differential and single-ended signals.

DESCRIPTION OF THE RELATED ART

As the circuit speed increases, differential signaling has become a preferred method for data transmission in such applications as personal computers, servers, switches, and routers.

For the differential victim pair being considered, unwanted electromagnetic coupling (i.e., crosstalk) from neighboring aggressor pairs occurs throughout the data transmission path when at least one of these neighboring pairs is active. When the aggressor's transmitter and victim's receiver are physically far away from each other (located at different chips, for example), the crosstalk induced is called far-end crosstalk (or, FEXT). In general, the chip package, connector, cable, printed circuit board (PCB) traces and vias are all sources of FEXT in a chip-to-chip communication system, due to the close proximity of signal lines.

Several attempts at reducing FEXT have been made through the introduction of additional self or coupling inductance and/or capacitance in either a connector or a system. The idea was based on that FEXT is proportional to the difference between inductive and capacitive coupling coefficients, so therefore by balancing these two coupling coefficients, FEXT can be reduced. U.S. Pat. No. 7,317,318 B2 is an example of such an attempt as applied to a connector, and US Patent 2007/0275607 A1 is an example of such an attempt as applied to a system. However, such attempts have been relatively insufficient in reducing FEXT, particularly in higher frequency systems. Therefore, there is a need for better ways to reduce FEXT.

There have also been several inventions that have implemented apparatus for reducing or cancelling crosstalk, such as U.S. Pat. Nos. 6,120,330 and 5,679,027. However, these apparatus are specifically for the reduction or cancellation of near-end crosstalk (NEXT) at frequencies of 100 MHz or below in specifically RJ45 connector systems.

SUMMARY OF THE INVENTION

FEXT is a cumulative effect, and if there is more than one FEXT generator in the data transmission path (i.e., channel), the neighboring differential pair's polarity will be swapped at least once through a simple routing change. The swapping of neighboring pair's polarity results in the phase change of the following FEXT generators, so the cumulative FEXT from the following FEXT generators will cancel the cumulative FEXT from the preceding FEXT generators. Such polarity swapping, which is independent of inductive or capacitive coupling, can be applied to a chip package, a connector, a printed circuit board (PCB), or any differential system that experiences FEXT. Low-crosstalk chip packages and connectors can be designed with polarity swapping built-in. Systems with large individual FEXT components can also see big improvements in total FEXT by applying one or more embodiments of the invention.

In one aspect of the present invention, the idea is implemented in a data transmission system that includes a transmission end, a receiving end, at least one differential pair connected to the transmission end and the receiving end, each differential pair comprising a positive signal line and a negative signal line, wherein at least one differential pair undergoes polarity reversal at one or more locations between the transmission end and the receiving end such that at least one signal transmitted to the receiving end experiences reduced FEXT due to the polarity reversal.

Additional aspects of the present invention include a system involving a transmission end; a receiving end; at least one single ended signal line; at least one differential pair connected to the transmission end and the receiving end; each differential pair comprising a positive signal line and a negative signal line; and wherein one or more differential pairs undergo polarity reversal at one or more locations between the transmission end and the receiving end.

Additional aspects of the present invention include a system that includes a transmission end, a receiving end, at least one differential pair connected to the transmission end and the receiving end, the differential pair comprising a positive signal line and a negative signal line, wherein the skew among differential pairs is minimized to improve FEXT cancellation.

Additional aspects of the present invention include a system that includes a transmission end, a receiving end, at least one single ended signal line, at least one differential pair connected to the transmission end and the receiving end, the differential pair comprising a positive signal line and a negative signal line, wherein the skew among differential pairs and single-ended signals is minimized to improve FEXT cancellation.

Additional aspects of the present invention include a system that includes a transmission end, a receiving end, at least one single ended signal line, at least one differential pair connected to the transmission end and the receiving end, the differential pair comprising a positive signal line and a negative signal line, wherein the polarity reversal location or locations among FEXT sources are optimized to achieve maximum FEXT cancellation.

Additional aspects of the present invention include a connector that includes a transmission end; a receiving end; multiple differential pairs connected to the transmission end and the receiving end; each differential pair comprising a positive signal line and a negative signal line; wherein at least one differential pair undergoes a polarity reversal at a location between the transmission end and the receiving end.

Additional aspects of the present invention include a connector that includes a transmission end; a receiving end; at least one single-ended signal; at least one differential pair connected to the transmission end and the receiving end; each differential pair comprising a positive signal line and a negative signal line; wherein at least one differential pair undergoes a polarity reversal at a location between the transmission end and the receiving end.

Additional aspects related to the invention will be set forth in part in the description which follows, and in part will be obvious from the description, or may be learned by practice of the invention. Aspects of the invention may be realized and attained by means of the elements and combinations of various elements and aspects particularly pointed out in the following detailed description and the appended claims.

It is to be understood that both the foregoing and the following descriptions are exemplary and explanatory only and are not intended to limit the claimed invention or application thereof in any manner whatsoever.

BRIEF DESCRIPTION OF THE DRAWINGS

The accompanying drawings, which are incorporated in and constitute a part of this specification exemplify the embodiments of the present invention and, together with the description, serve to explain and illustrate principles of the inventive technique. Specifically:

FIG. 7 illustrates typical mezzanine connectors.

FIGS. 10(a) to 10(g) illustrate an example embodiment of the invention as applied to a mezzanine connector.

FIG. 13 illustrates typical backplane connectors.

FIG. 15a illustrates a conventional card edge connector, and FIG. 15b is an example embodiment of the invention as applied to a card edge connector.

DETAILED DESCRIPTION

In the following detailed description, reference will be made to the accompanying drawing(s), in which identical functional elements are designated with like numerals. The aforementioned accompanying drawings show by way of illustration, and not by way of limitation, specific embodiments and implementations consistent with principles of the present invention. These implementations are described in sufficient detail to enable those skilled in the art to practice the invention and it is to be understood that other implementations may be utilized and that structural changes and/or substitutions of various elements may be made without departing from the scope and spirit of present invention. The following detailed description is, therefore, not to be construed in a limited sense.

Figure 1:
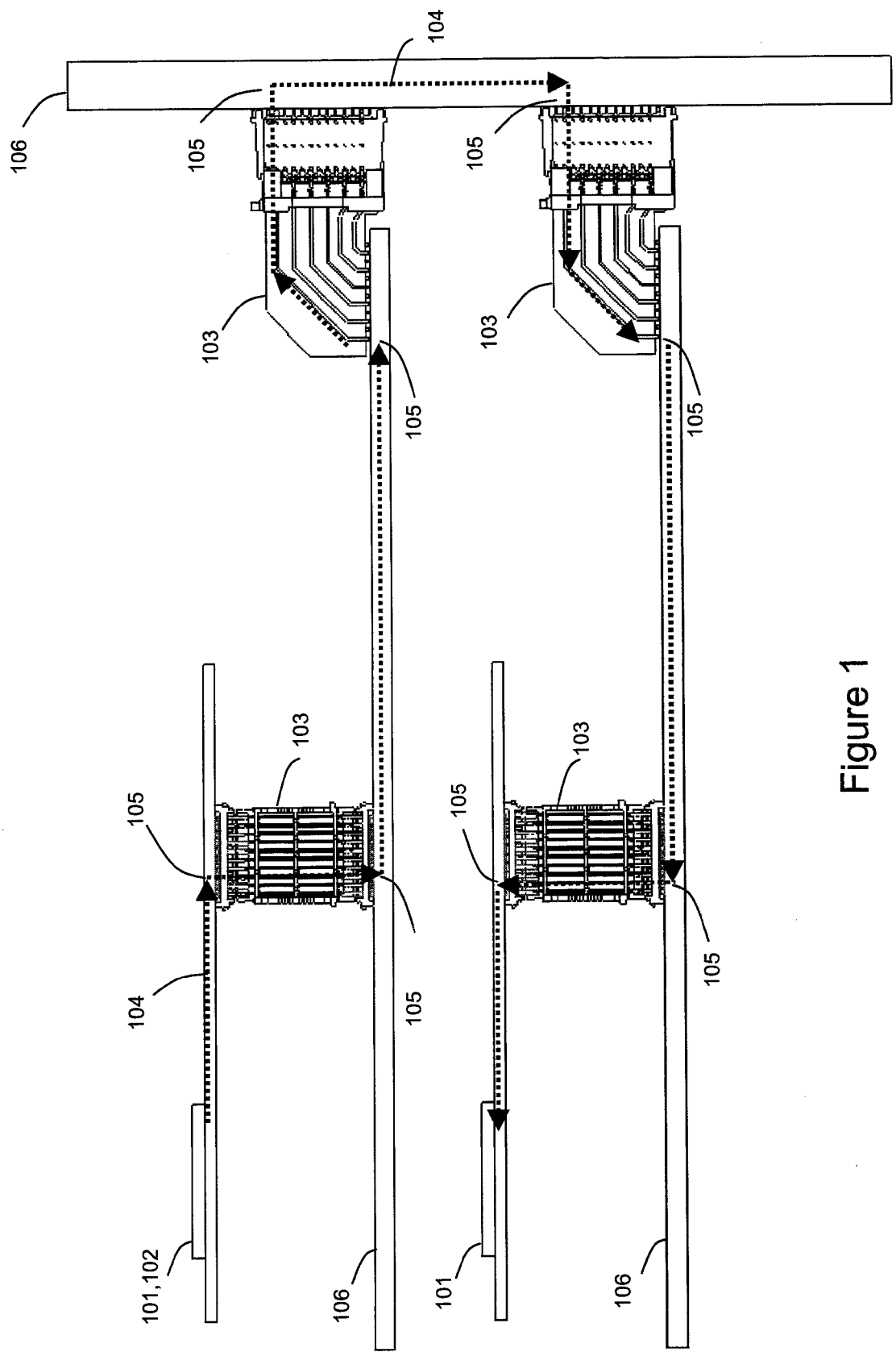
FIG. 1 shows an example chip-to-chip communication system where FEXT can occur.

FIG. 1 shows an example of a chip-to-chip communication system, where the signal sent by the transmitter 101 can go through multiple chip packages 102, connectors 103, and traces 104 and vias 105 in printed circuit boards (PCB) 106 before arriving at the receiver 107. Chip packages, connectors, PCBs, and cables are all components that can be utilized within such a chip-to-chip system.

Figure 2:
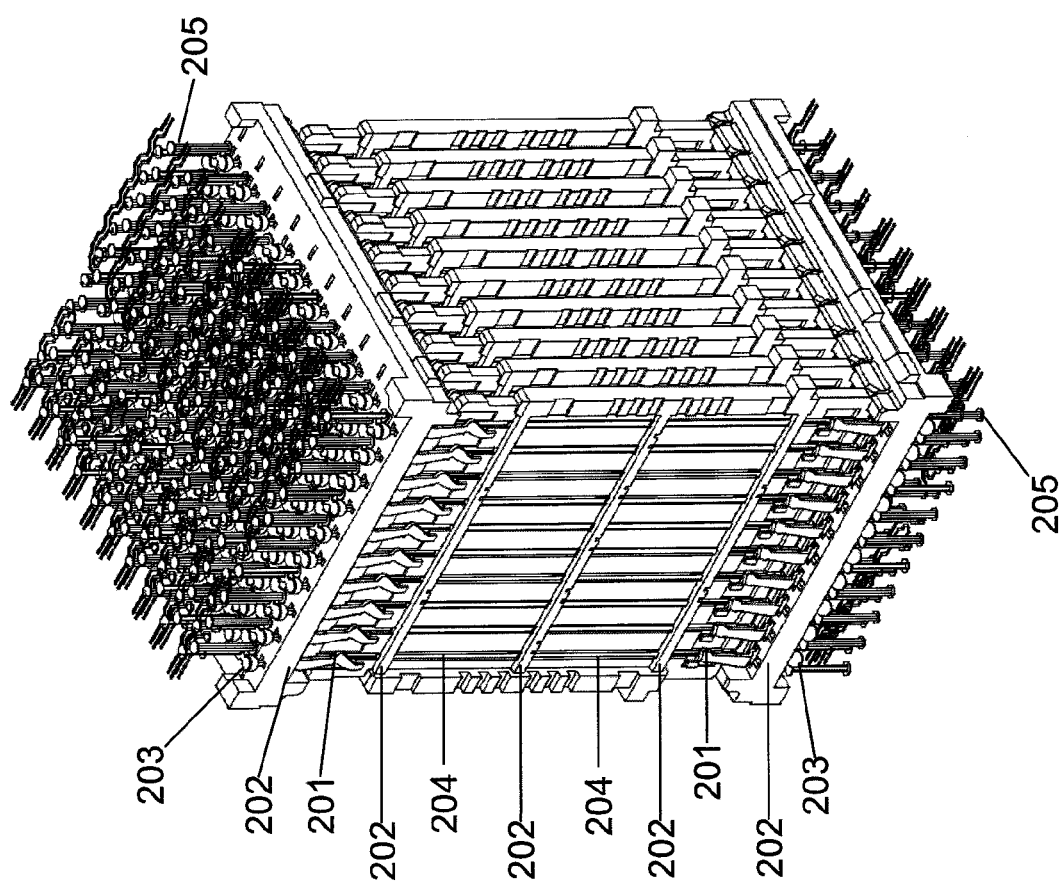
FIG. 2 shows an example connector where FEXT can occur.

FIG. 2 shows an example of an electrical connector, where a signal being transmitted through the connector can go through mating portions 201, retention portions 202, solder tails 203, conductors 204 or vias 205 before or after the connector.

Figure 3:
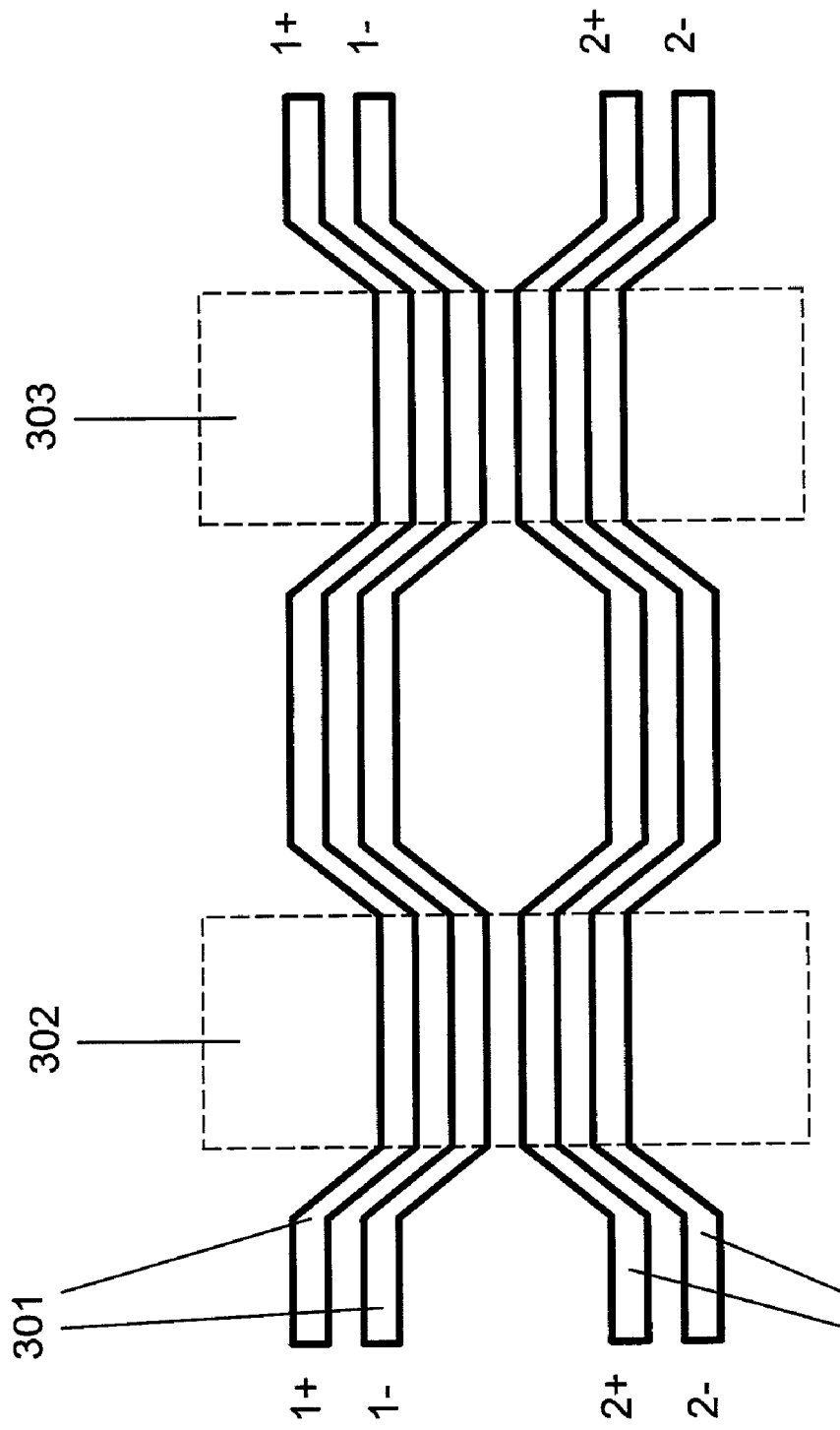
FIG. 3 illustrates two differential pairs of a system that contains two sources of FEXT.

FIG. 3 illustrates two differential pairs 300-301 with two FEXT sources 302-303. These FEXT sources can be chip packages, connectors, PCB vias or PCB traces as shown in FIG. 1. These FEXT sources can also be mating portions, retention portions, solder tails within a connector, traces, or vias before or after a connector as shown in FIG. 2. These FEXT sources can also be bond wires, traces, lead frames, or solder balls within a chip package. To illustrate how the polarity swapping idea works, we consider an example of two differential pairs, in which there are two FEXT sources, and the traces before, between, and after the sources contribute no crosstalk.

Figure 4:
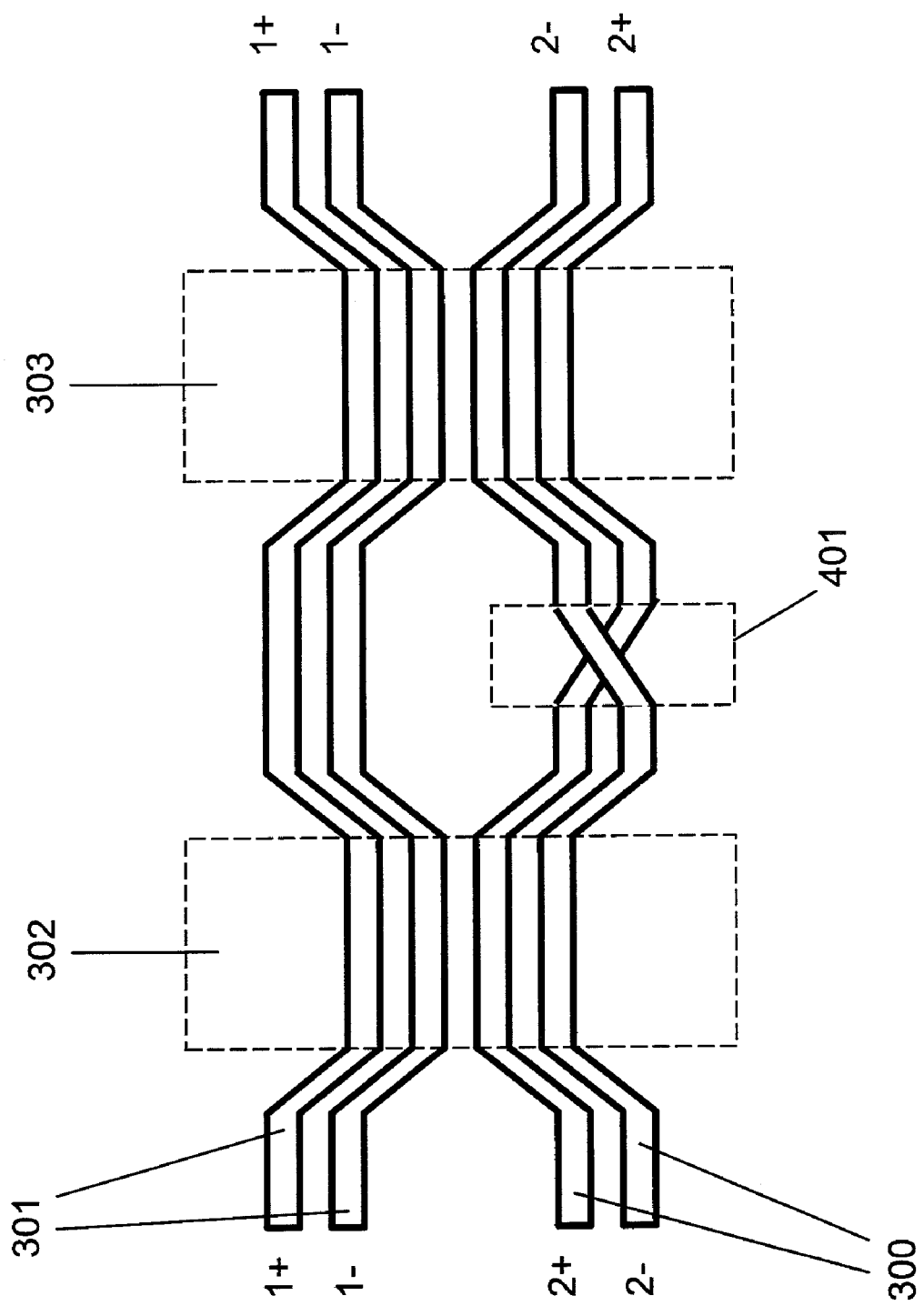
FIG. 4 illustrates an embodiment of the present invention implementing polarity swapping when applied to the differential system of FIG. 3.

FIG. 4 shows the modified differential pairs utilizing one or more embodiments of the inventive polarity swapping technique, where the relative positions of two differential pairs change from (1+, 1−, 2+, 2−) to (1+, 1−, 2−, 2+) at some point 401 between the two FEXT sources. Pair 2 has 5 ps more delay than pair 1 in this case because pair 2 requires additional trace length to swap positions. In this example, by swapping the relative positions of the positive and negative signal lines of the aggressor differential pair, a large amount of the accumulated FEXT becomes negated by the subsequent inverted FEXT.

Figure 5:
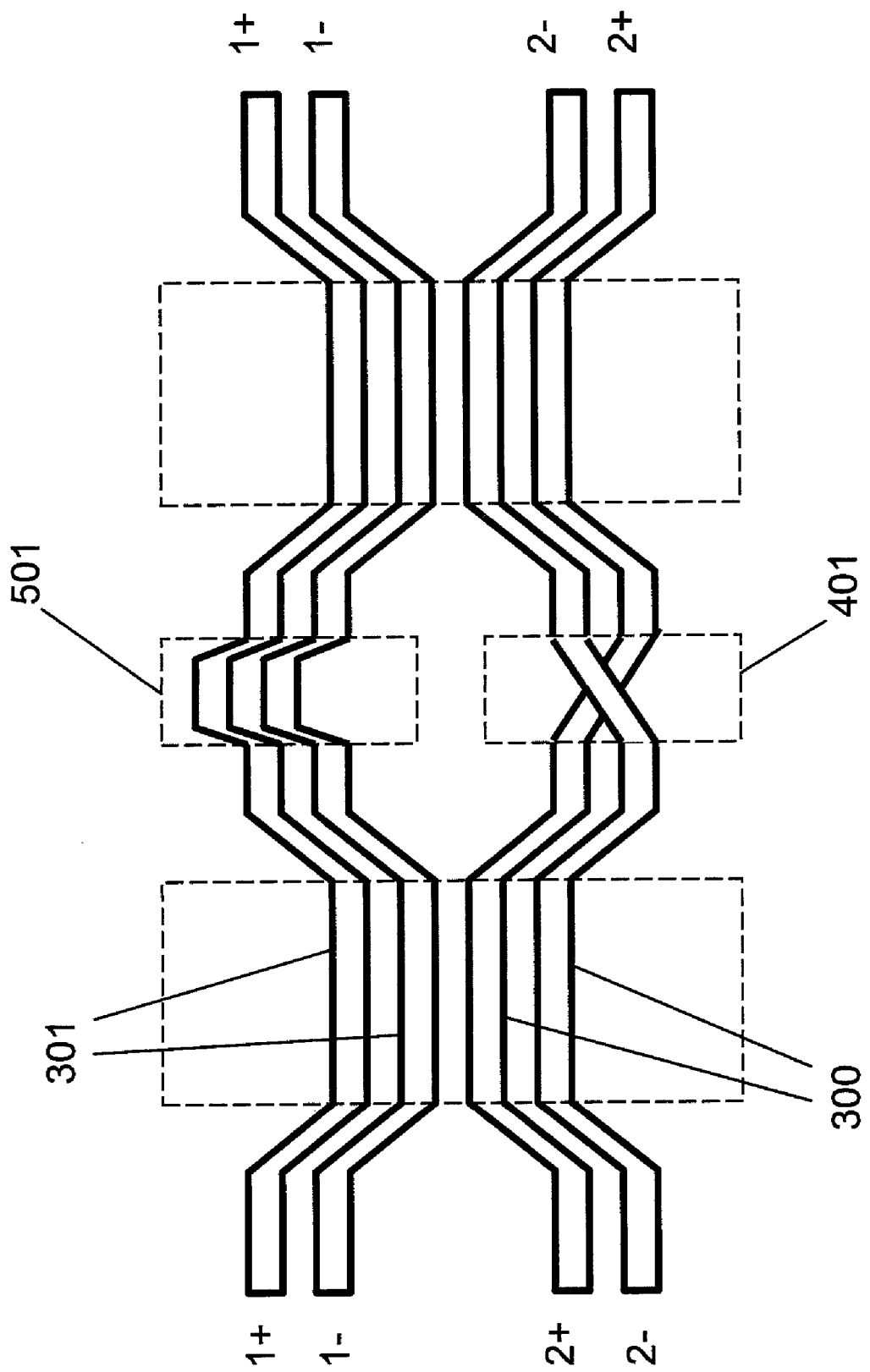
FIG. 5 illustrates an embodiment of the present invention implementing polarity swapping and skew minimization applied to the differential system of FIG. 3.

FIG. 5 illustrates the modified differential pairs utilizing one or more embodiments of the inventive polarity swapping technique 401 and a skew adjustment technique 501 at some point between the two FEXT sources. In this example, by swapping the relative positions of the positive and negative signal lines of the aggressor differential pair and matching the delay between the two differential pairs, the accumulated FEXT becomes almost completely negated by the subsequent inverted FEXT.

Figure 6:
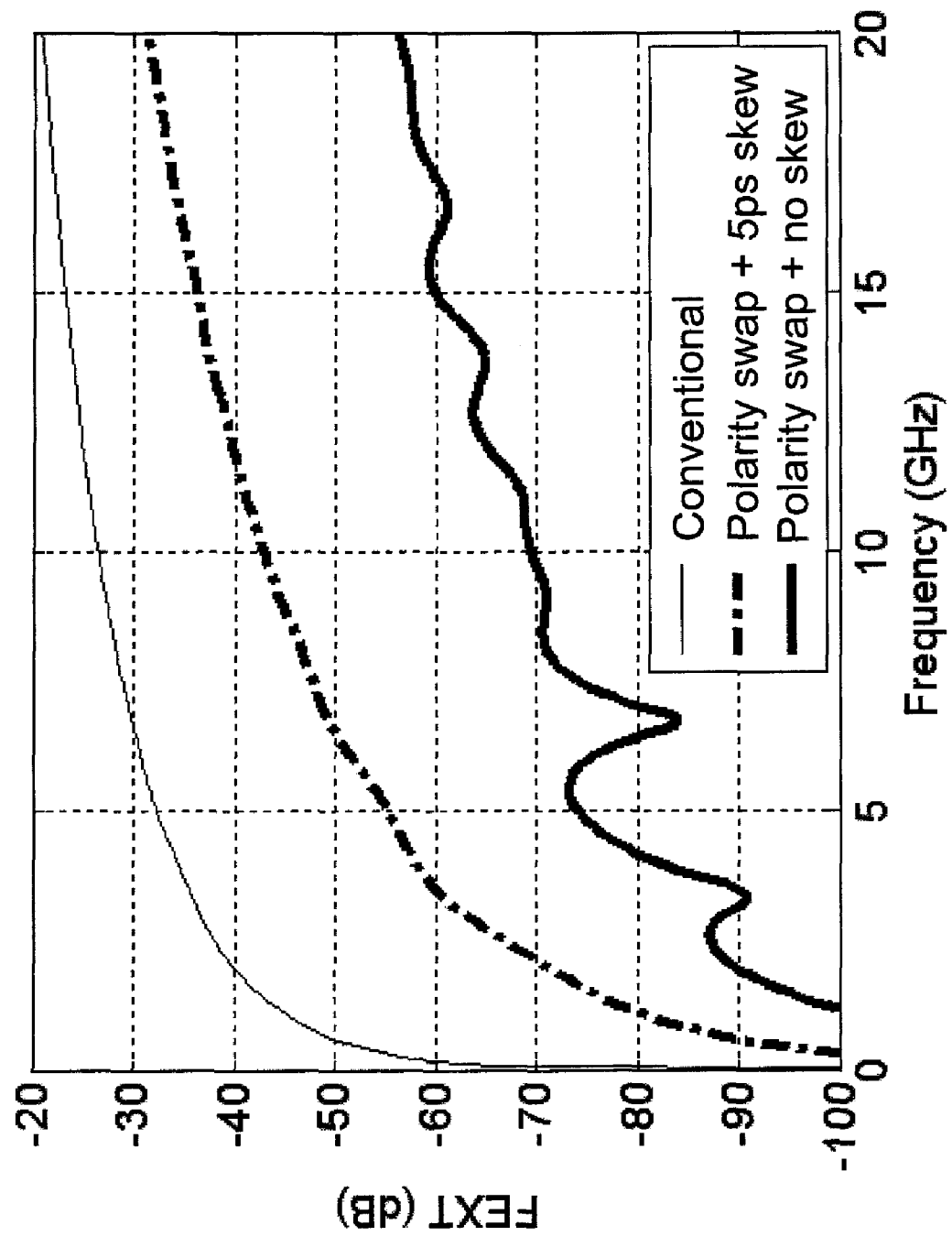
FIG. 6 illustrates the FEXT of the differential pairs of FIGS. 3-5.

FIG. 6 gives the FEXT of the differential pairs in FIGS. 3-5 in frequency domain. From this plot, it can be seen that FEXT is significantly reduced by utilizing one or more embodiments of this polarity swapping technique. The reason for such reduction can be roughly explained by the following. The two sources of coupling between Pairs 1 and 2 are temporarily assumed to be of equal magnitude for simplicity. The polarity swapping results in these two FEXTs being opposite in phase, and therefore they cancel each other. When there is a 5 ps skew introduced by the additional length required to swap the relative positions of the aggressor pair, the two FEXTs arriving at the receiver are not exactly opposite in phase, resulting in more FEXT than when the skew is eliminated. By adding some delay to the victim pair as done in FIG. 5 to remove the skew, the FEXT cancellation can be significantly improved as seen in FIG. 6. Rigorous mathematical derivation can be used to identify the propagating modes and explain the small left-over FEXT after the polarity change and skew elimination. Of especial interest in this simulation is the significant reduction of FEXT in high frequency systems where the differential pair is transmitting a signal of greater than 1 GHz. By utilizing the novel polarity reversal swapping technique, such higher frequency systems can be designed without significant worry in regards to FEXT. This would enable circuit speeds to go much faster than the current technology allows. However, lower frequency systems will also benefit from the use of the novel polarity swapping technique, which can be especially useful in systems that utilize both a differential pair and a single ended signal line.

This optimal location for the polarity swap is where the FEXT accumulated from one side is close to 50% of the total FEXT. Although, some FEXT will still be cancelled even if the FEXT induced before the swap is unequal to the FEXT after the swap.

In some cases, it may be optimal to swap multiple times among a plurality of FEXT sources.

Figure 8:
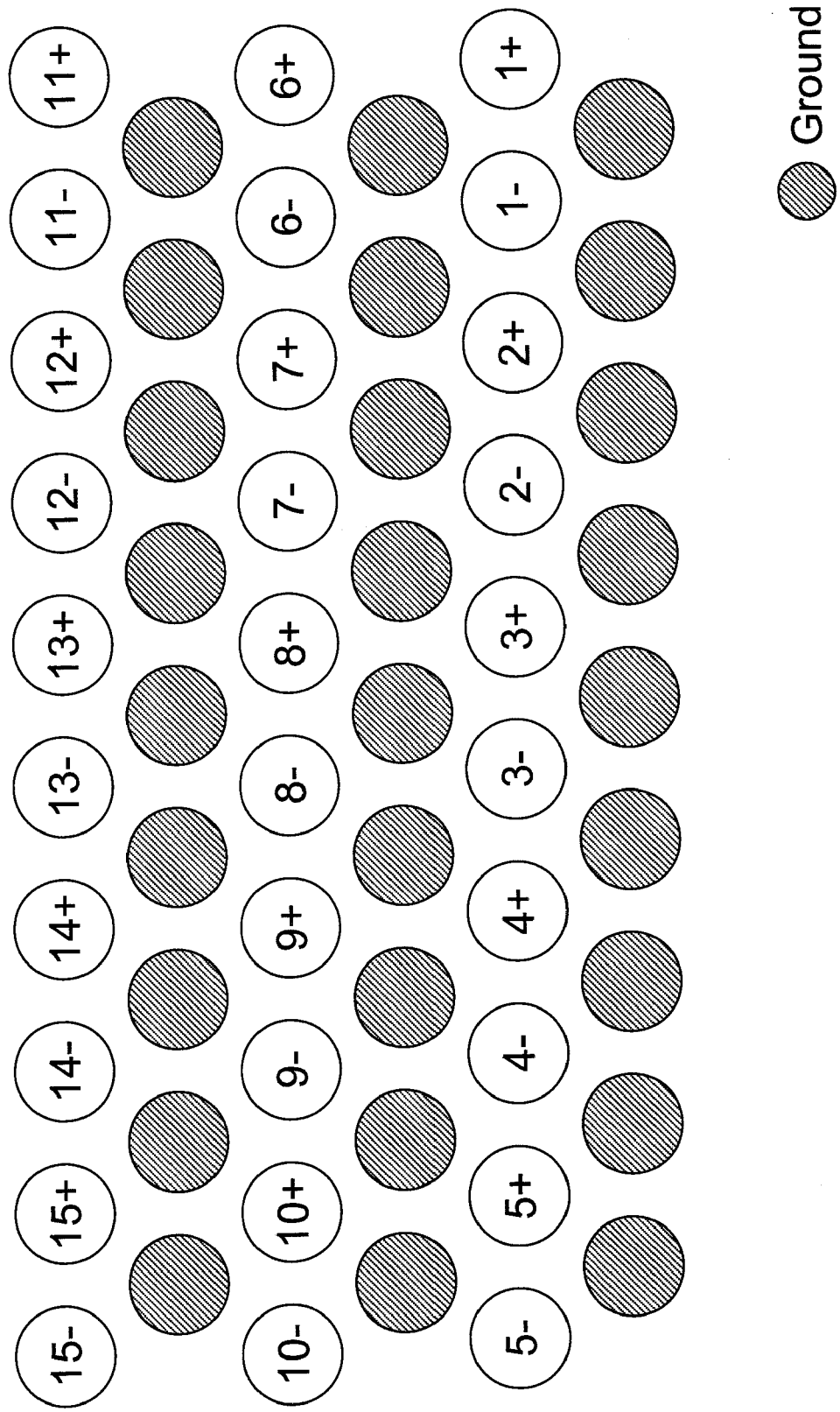
FIG. 8 illustrates the pin assignment for the three piece BGA mezzanine connector of FIG. 7a at both the entrance and exit.
Figure 9:
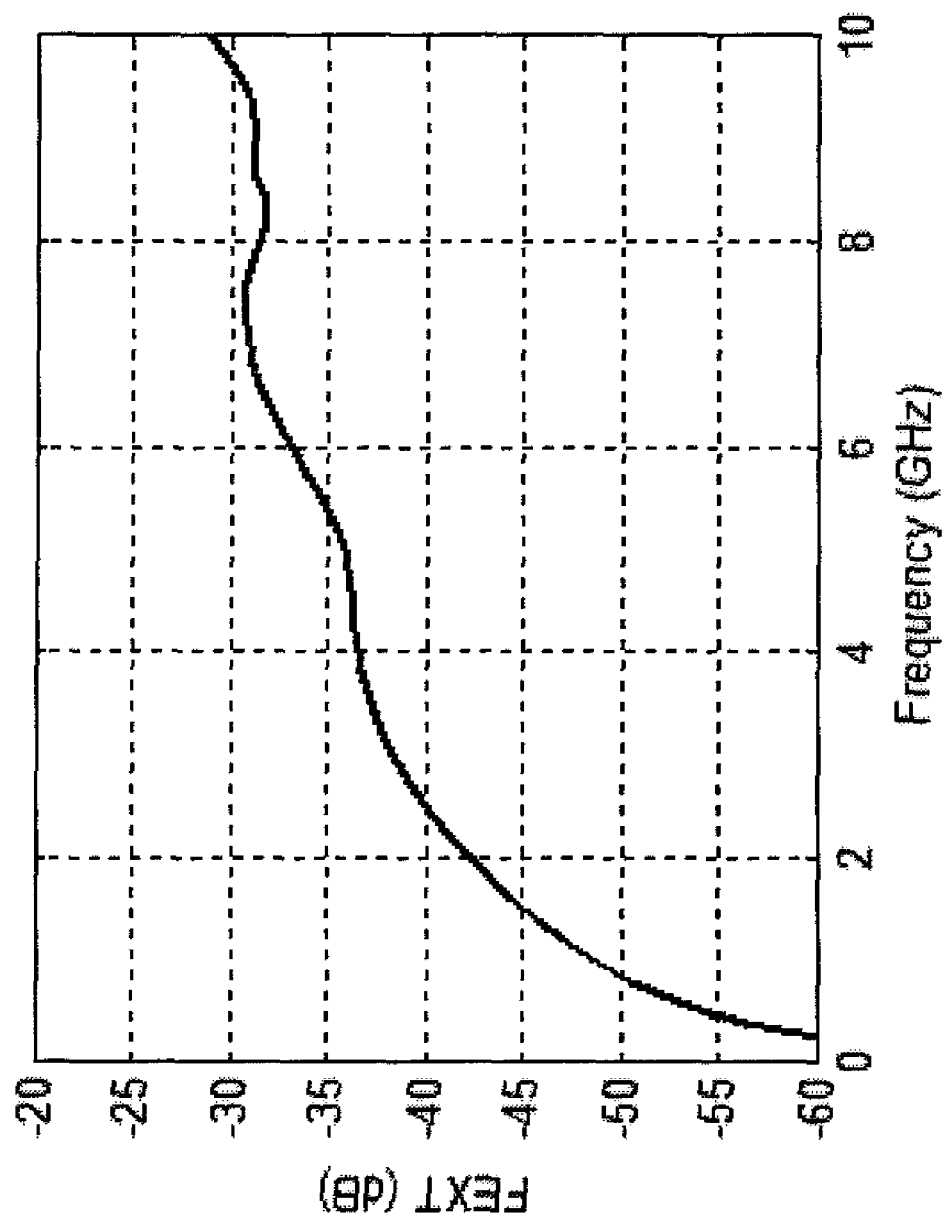
FIG. 9 illustrates the FEXT between differential pairs 8 and 9 on a typical mezzanine connector of FIG. 7a and FIG. 8.
Figure 11A:
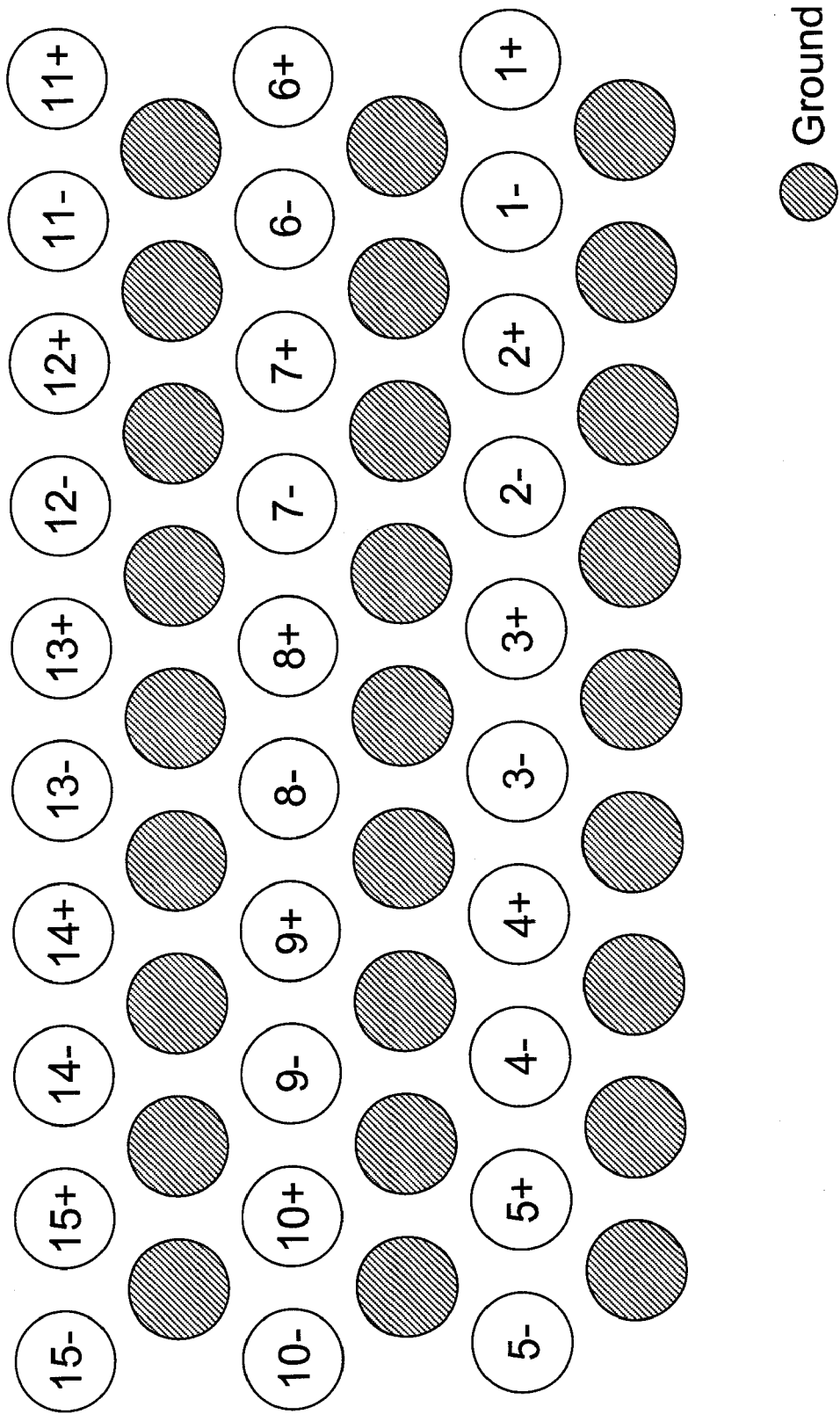
FIGS. 11a and 11b illustrate the pin assignment of the mezzanine connector at the entrance and exit respectively, as indicated by an embodiment of the invention.
Figure 11B:
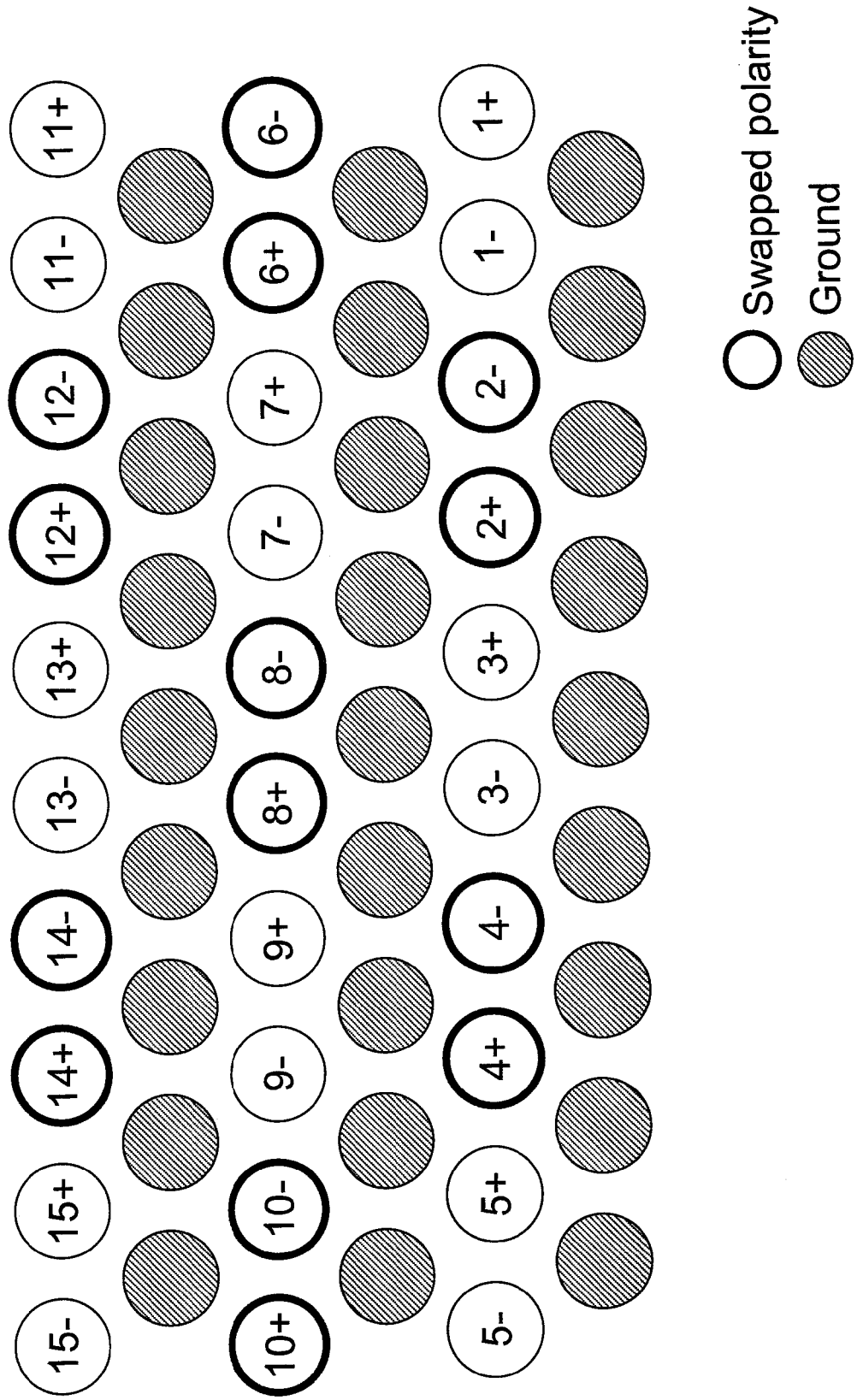
Figure 12:
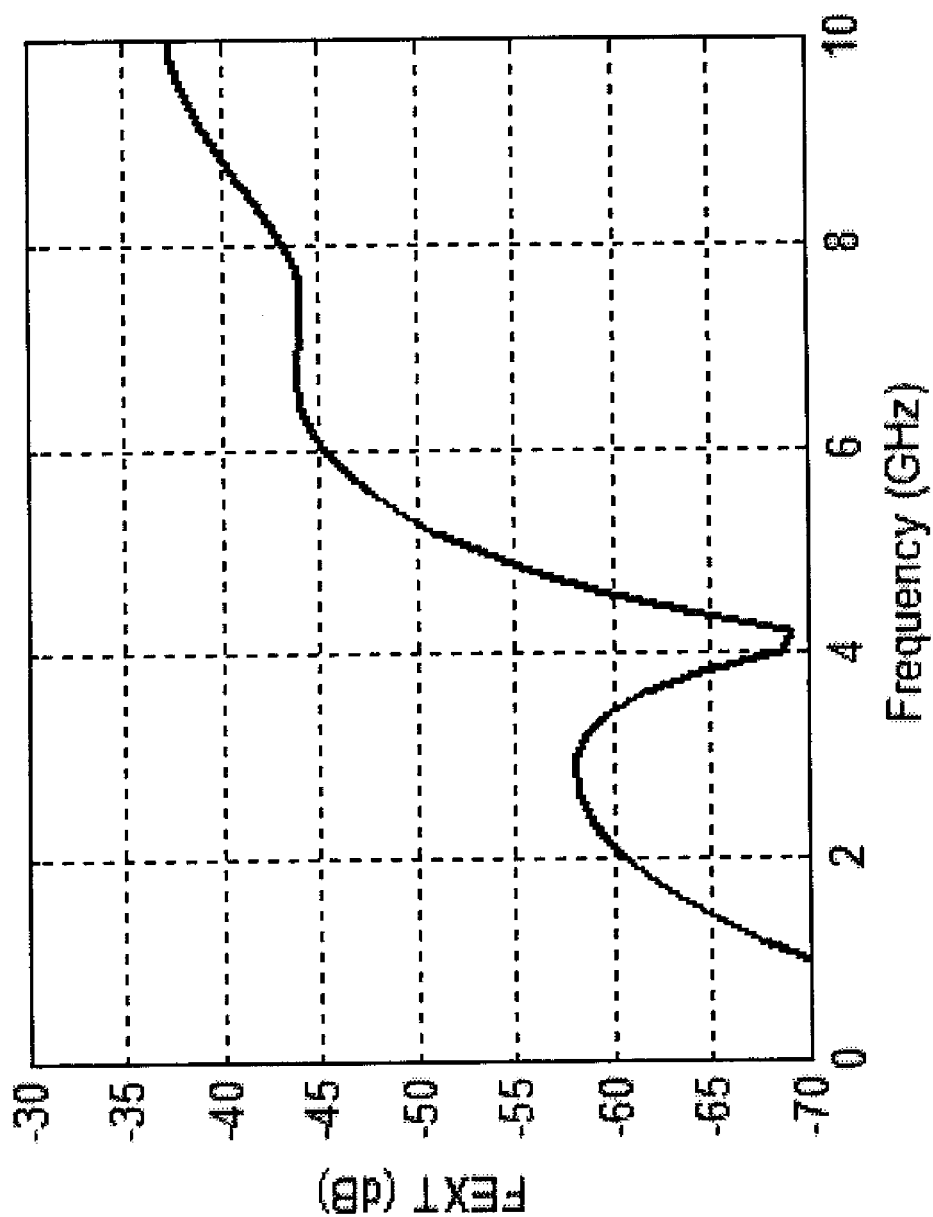
FIG. 12 illustrates the improvement on the FEXT between differential pairs 8 and 9 on the mezzanine connector of FIGS. 10, 11a and 11b.

Moreover, the embodiments of the inventive polarity swapping technique can also be applied to the design of individual components. FIG. 7 shows examples of a two piece mezzanine connector 705 and a three piece mezzanine connector 701 that the polarity swapping technique can be applied to. The two piece connector is comprised of a plug 706 and a receptacle 707. The three piece connector is comprised of two receptacles 702 and one interposer 703. The interposer, in turn, contains multiple wafers 704, where each wafer has 10 signal traces and one ground plane. Solder balls are attached to the connector; their corresponding pin assignments for three wafers are shown in FIG. 8; and differential FEXT between Pairs 8 and 9 is shown in FIG. 9. FIGS. 10(a) to 10(g) illustrate the improved three piece connector implementing an embodiment of the polarity swapping technique. The side view as shown in FIG. 10(a) shows multiple wafers inserted into the interposer. The signal traces swap their relative positions on the wafers for every other differential pair. Two types of wafers are used. One type has the center pair swapped 1005, as shown in FIG. 10(c) and FIG. 10(e). The other type has the center pair non-swapped 1006, as shown in FIG. 10(b) and FIG. 10(d). These two wafer types are placed adjacent to each other within the interposer so that the swapped pairs are staggered from one wafer to the next. In this configuration the FEXT from the nearest neighbors are drastically reduced. Details of the swapping portion 1003 can be seen from the perspective view of FIGS. 10(b) and 10(c), with a close up view as shown in FIG. 10(f). To achieve optimal FEXT cancellation, the wafers were designed to have very little inter-pair skew. This was done by purposely adding delay to the non-swapped pairs. Details of the delay adjustment portion can be seen in 1004, with a close up view as shown in FIG. 10(g). The corresponding pin assignments of solder balls and differential FEXT between Pairs (8+, 8−) and (9+, 9−) are shown in Figures 11a-b and 12, respectively. It is apparent that utilizing one or more embodiments of the invention results in FEXT of FIG. 12 being significantly less than FEXT of FIG. 9. This polarity swapping technique is also applicable to the two piece mezzanine connector.

Figure 14:
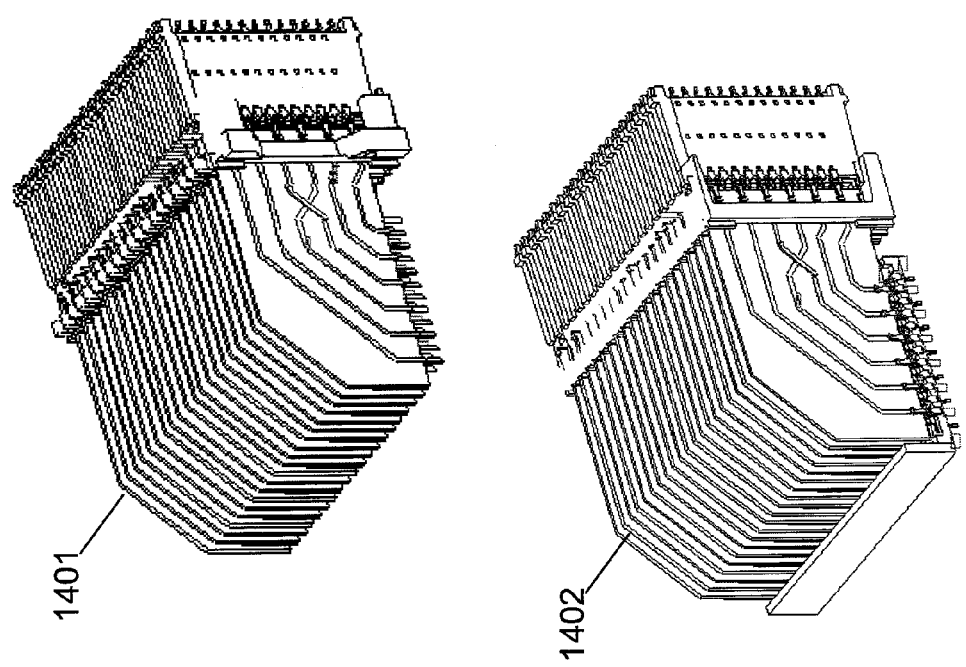
FIG. 14 illustrates example embodiments of the invention as applied to backplane connectors.

The polarity swapping technique can also be applied to backplane connectors. FIG. 13 shows examples of a three piece backplane connector 1301 and a two piece backplane connector 1305. The three piece backplane connector consists of two receptacles 1302-1303 and an interposer 1304. The two piece backplane connector is comprised of a plug 1306 and a receptacle 1307. Examples of how the two piece backplane connector 1401 and the three piece backplane connector 1402 can utilize the polarity swapping technique are illustrated in FIG. 14.

FIG. 15 illustrates an example of how one or more embodiments of the polarity swapping technique can be applied to a card edge connector. A conventional card edge connector 1501 has differential pairs that go straight through. Details of the straight pairs 1503 are shown. A card edge connector utilizing this polarity swapping technique 1502 has differential pairs that swap. Details of this implementation 1504 show how these pairs are swapped.

Figure 16A:
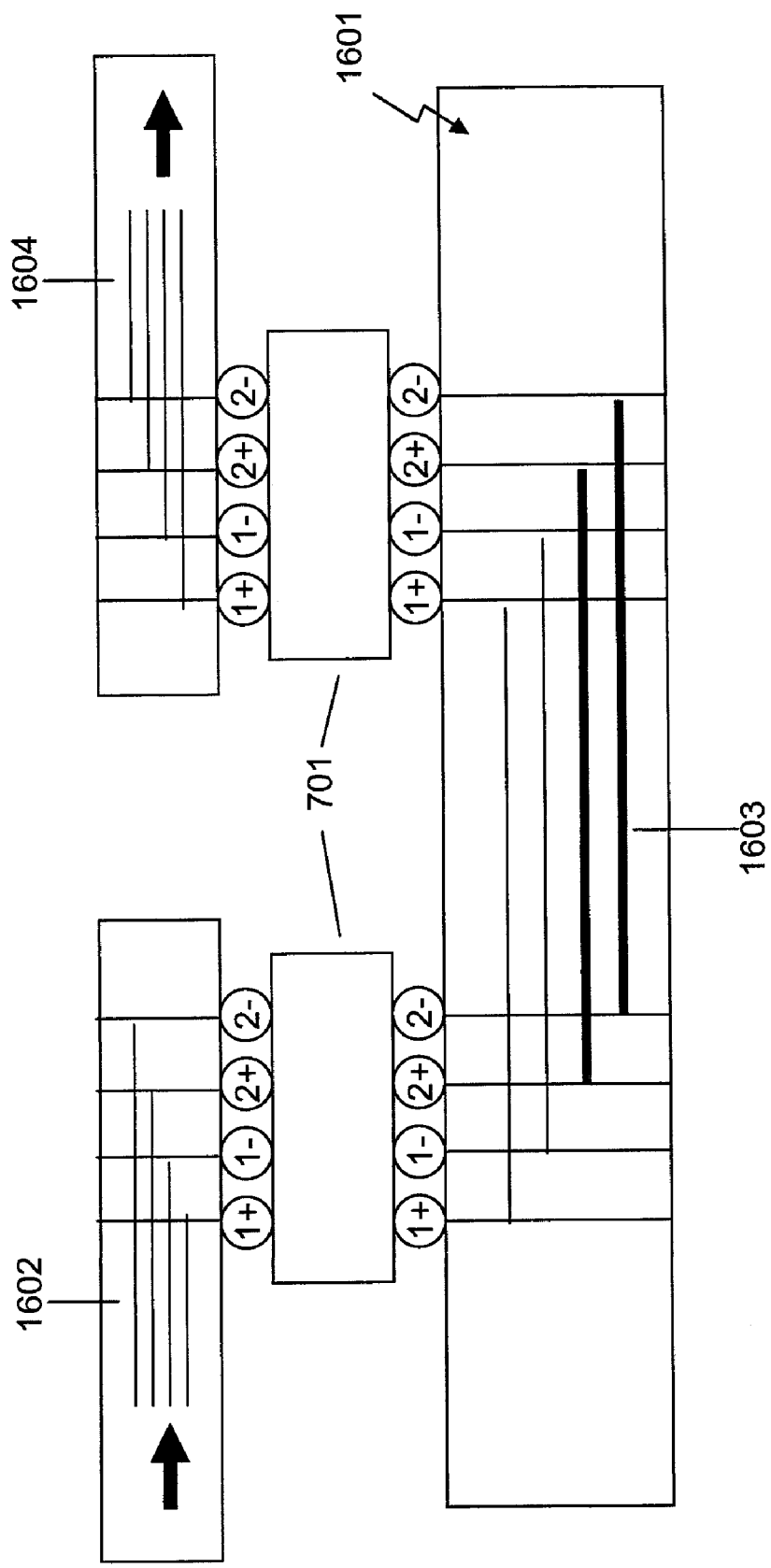
FIG. 16 illustrates a section of data transmission path in a chip-to-chip communication system with two connectors.
Figure 16B:
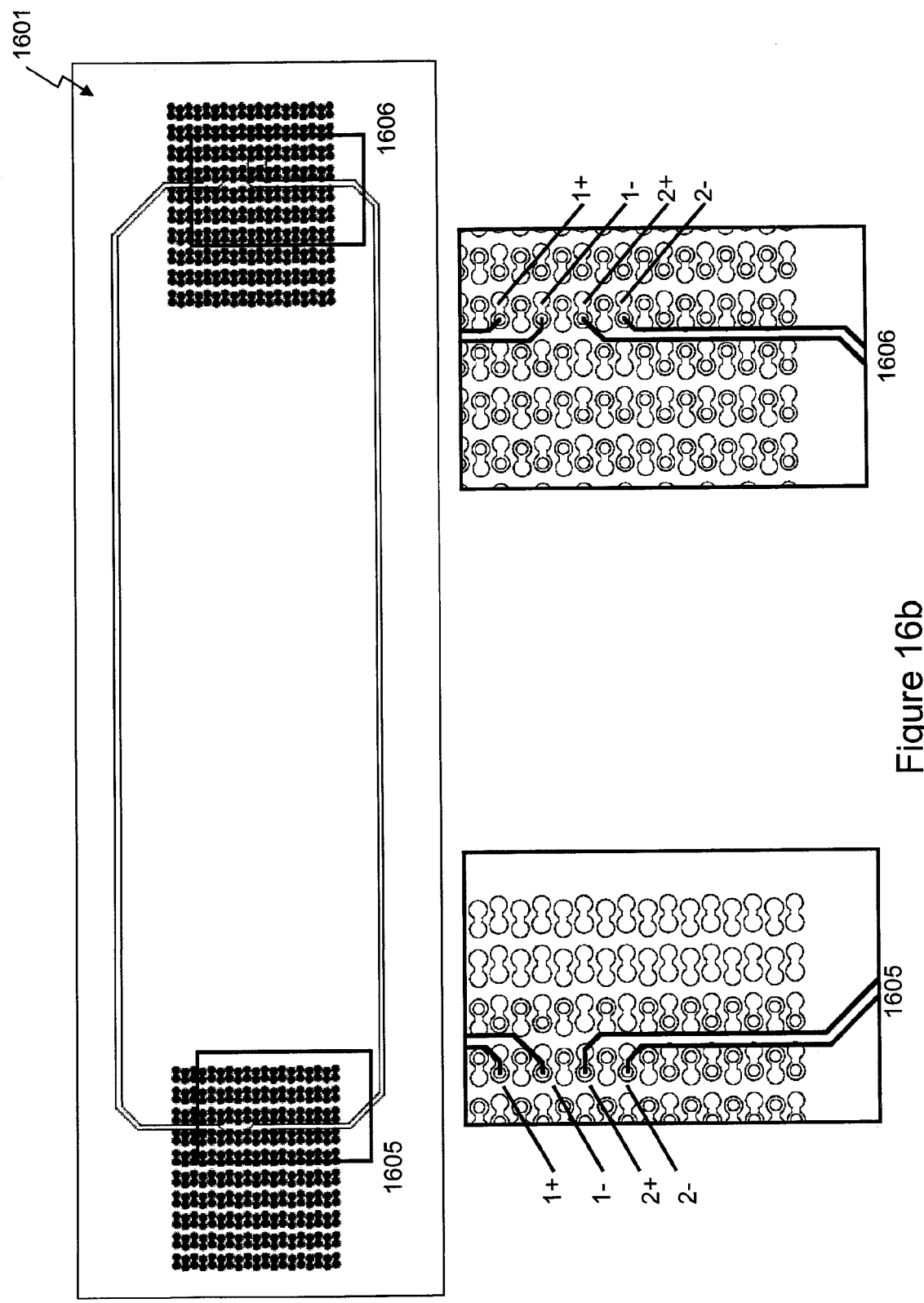

FIG. 16a shows a portion of a conventional chip-to-chip communication system where two connectors 701 from FIG. 7 are used in a "channel" with 3" PCB trace 1602, 6" PCB trace 1603, and 3" PCB trace 1604 routed on the inner signal layers as an example. The top view layout of the PCB 1601 linking the two connectors is shown in FIG. 16b. Details of how the PCB traces are routed out from the connectors are shown in the detail views 1605-1606. In this conventional way of routing, the polarities of the two differential pairs, (1+, 1−) and (2+, 2−), are maintained from one connector to the next. The relative locations of the positive and negative signal lines remain the same at each connector. With such conventional routing, the FEXT generated by each connector will accumulate.

Figure 17A:
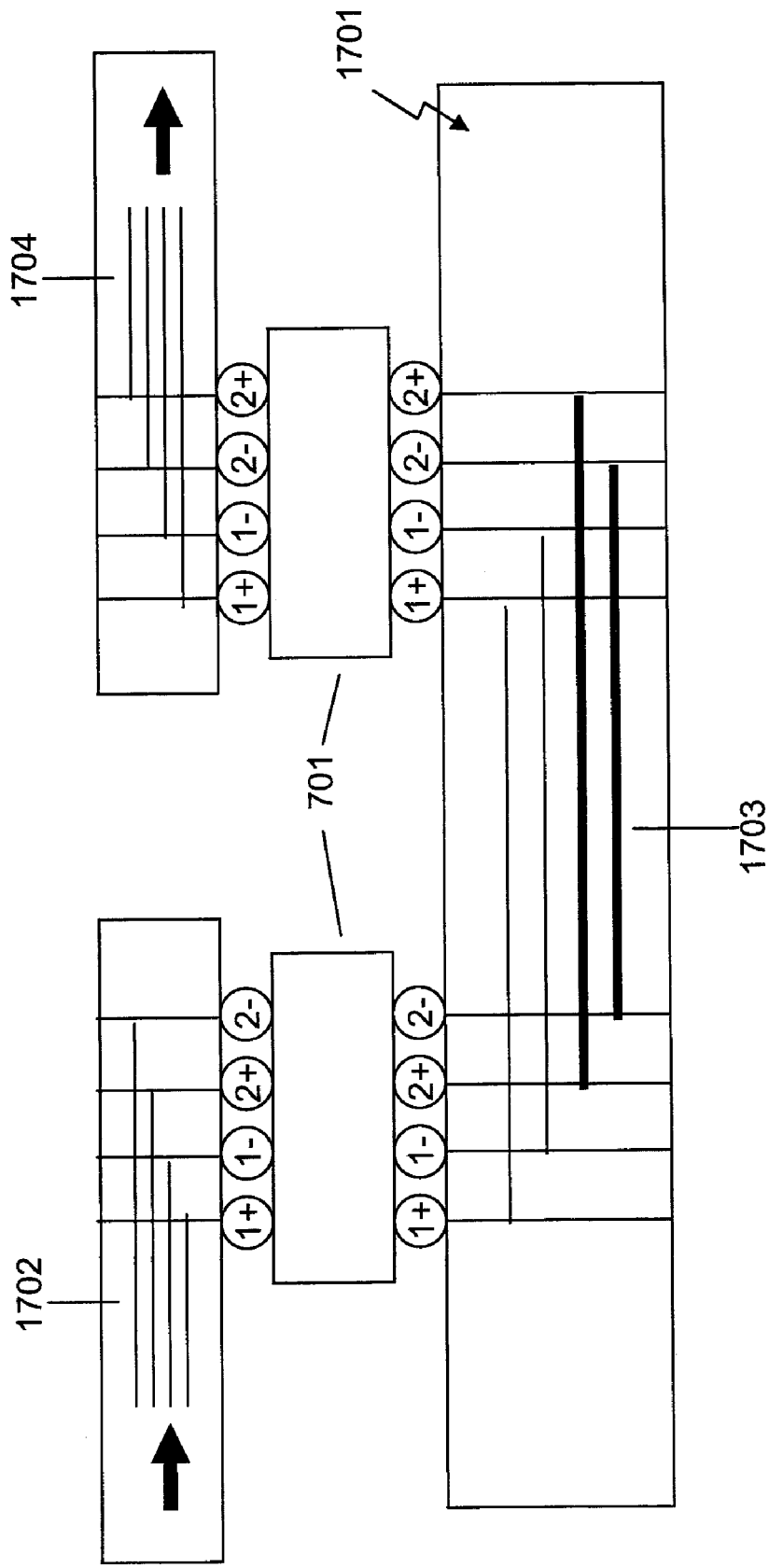
FIG. 17 illustrates the application of an embodiment of the present invention to the system design of FIG. 16.
Figure 17B:
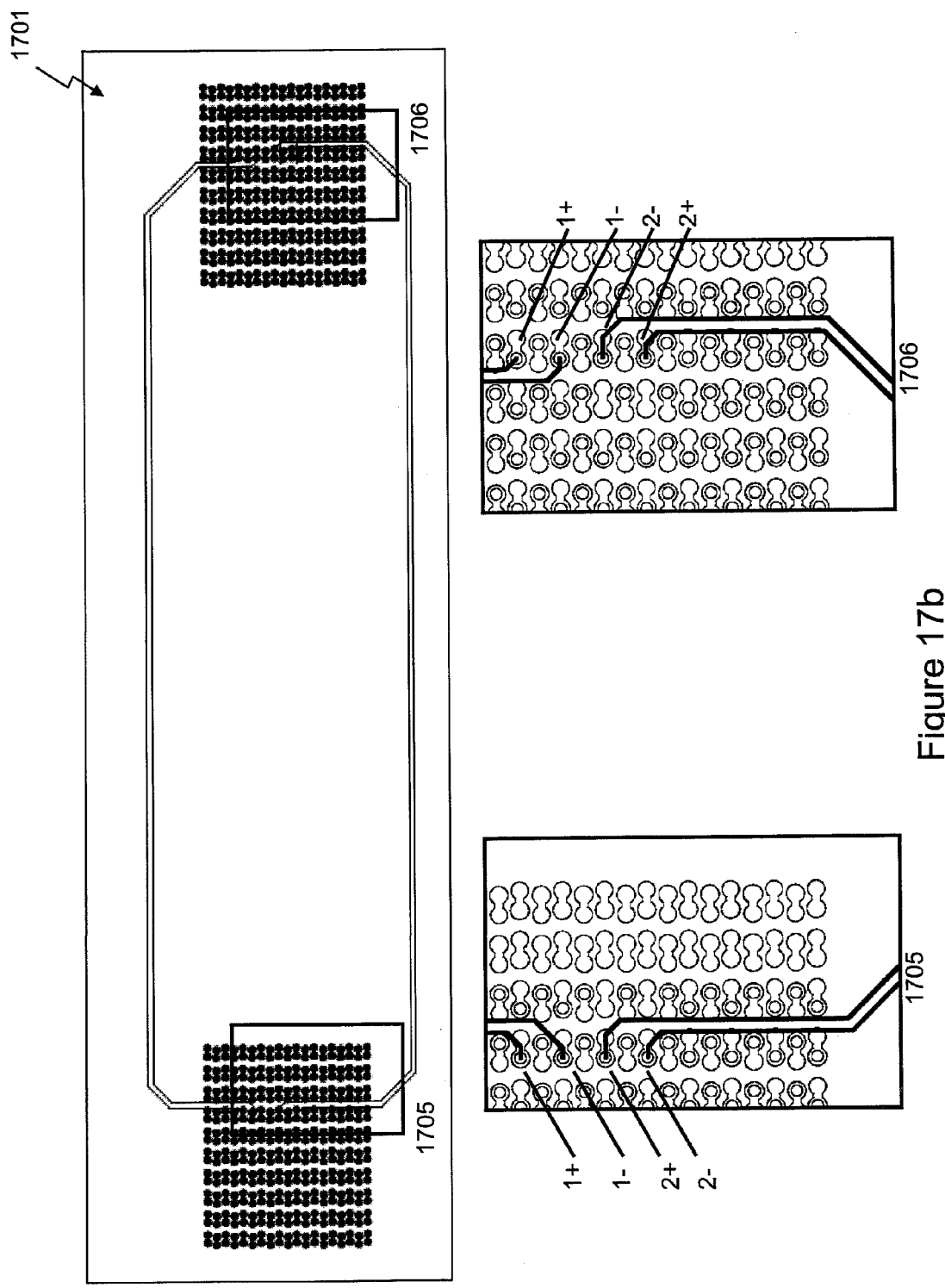

FIG. 17a shows a portion of a chip-to-chip communication system utilizing one or more embodiments of the present invention. Similar to FIG. 16a, it consists of two connectors 701 in a "channel" with 3" PCB trace 1702, 6" PCB trace 1703, and 3" PCB trace 1704 routed on the inner signal layers. The top view layout of the PCB 1701 linking the two connectors is shown in FIG. 17b. Details of how the PCB traces are routed out from the connectors are shown in detail views 1705-1706. It can be seen that, unlike the system of FIG. 16a-b, the system of FIG. 17a-b has the polarity of differential pair (2+, 2−) swapped from one connector to the next. The differential pairs are configured 1+, 1−, 2+, and 2− at the connector to the left and configured 1+, 1−, 2−, and 2+ at the connector to the right. The relative locations of differential pair (2+, 2−) have changed from one connector to the next. Because of the polarity swapping, the FEXT generated from the two connectors will cancel.

Figure 18:
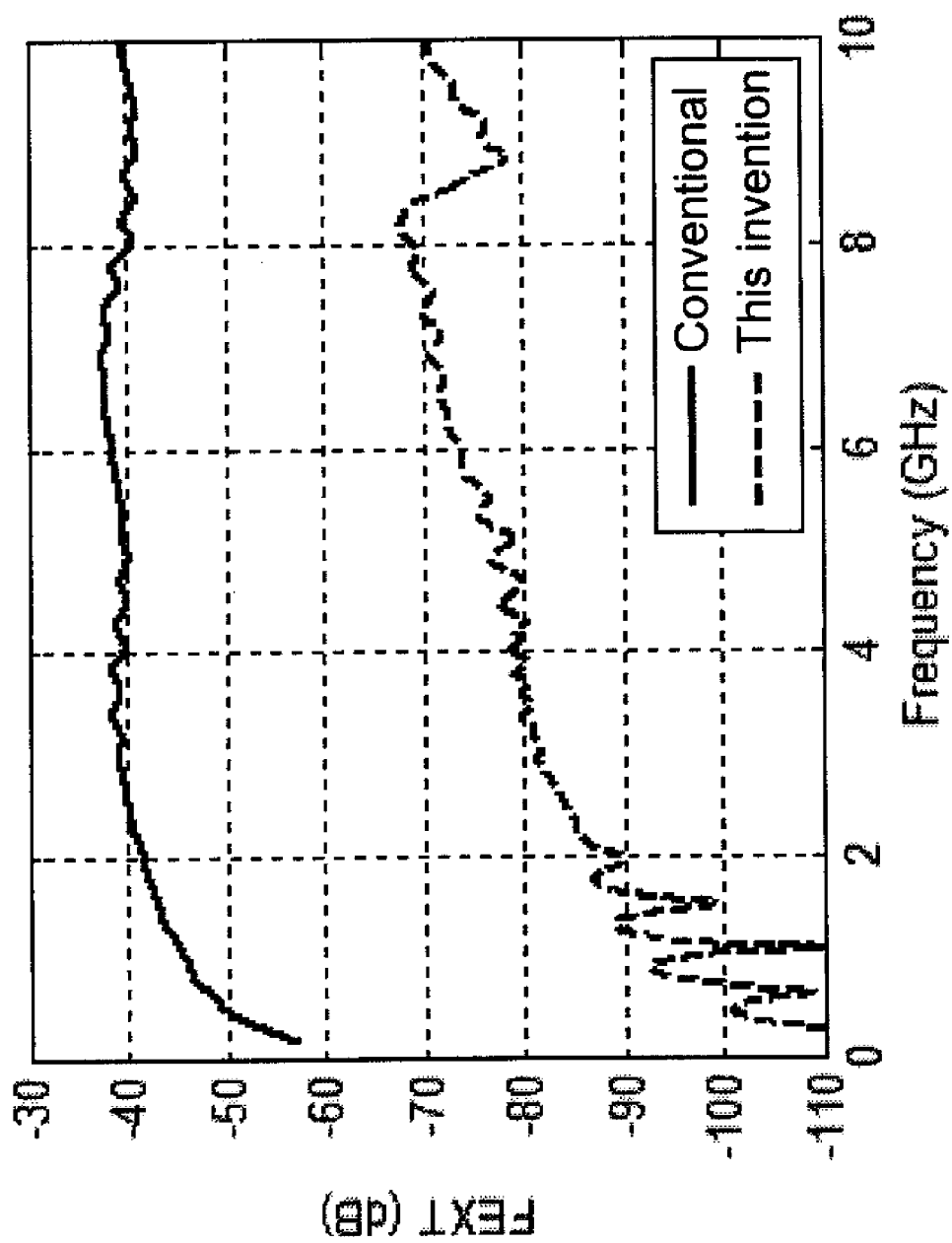
FIG. 18 compares the FEXT of a typical system design versus the system design applying an embodiment of the invention.

FIG. 18 shows the FEXT between differential pairs (1+, 1−) and (2+, 2−) for the systems of FIGS. 16a-b and FIGS. 17a-b. It can be seen that the use of one or more embodiments of the invention reduces FEXT dramatically in a system.

Figure 19:
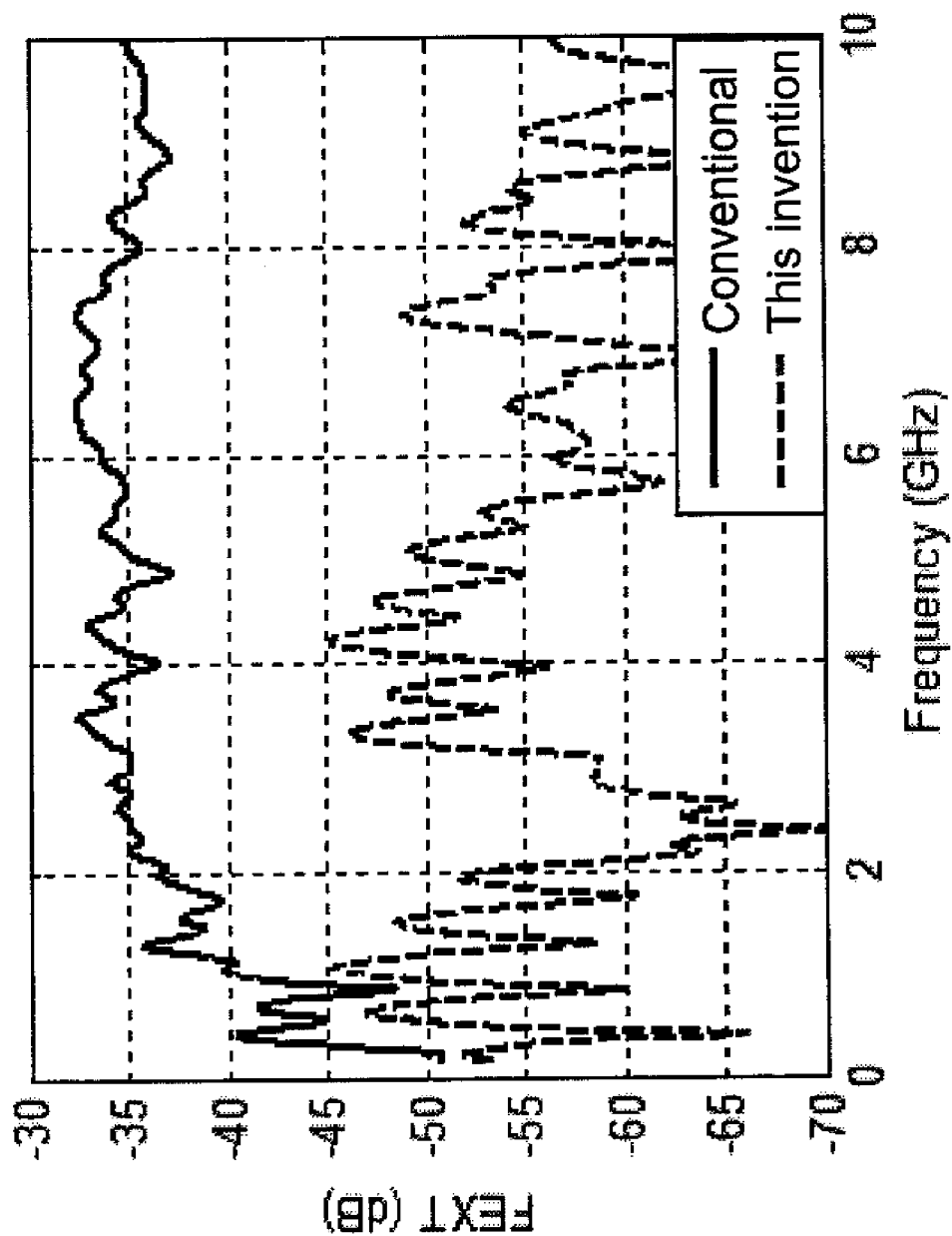
FIG. 19 illustrates how the FEXT between the single-ended signal 1− and differential pair signal 2+ and 2− is also significantly reduced with the application of an embodiment of the present invention.

So far, we have focused on FEXT between two differential pairs. However, the embodiments of the invention are applicable to FEXT between a differential pair and a single-ended signal as well. Let us consider 1+ and 1− in FIGS. 16 and 17 as two independent single-ended signals. FIG. 19 shows that FEXT between single-ended 1− and differential pair (2+, 2−) is also significantly reduced with the utilization of one or more embodiments of the invention. From this example, it is therefore possible to reduce FEXT even in a system involving a differential pair and a neighboring single-ended signal.

Figure 20A:
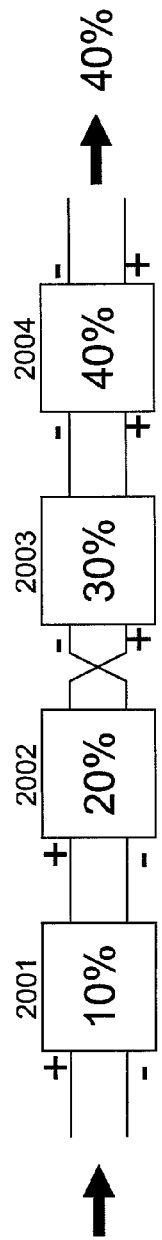
FIGS. 20a-d show examples of one or more embodiments of the invention with one or more polarity reversals among a plurality of FEXT sources.

The embodiments of the invention are not limited to only one polarity swap between two FEXT sources. The polarity can be swapped more than once among a plurality of FEXT sources. FIGS. 20a-d show such examples, each consisting of four FEXT sources and at least one polarity reversal. FIG. 20a shows a victim differential pair going through four FEXT sources. An aggressor differential pair, which does not swap polarity, is located along side the victim pair but is not shown here. At the first FEXT source 2001, 10% of the aggressor signal couples over to the victim pair. At the second FEXT source 2002, 20% couples over. Since the polarity is maintained from the first source to the second, the FEXT accumulates to 30%. The victim pair then swaps polarity before entering the third FEXT source 2003, where 30% of the aggressor signal couples over. Because the polarity of the victim pair was swapped before entering the third source, the FEXT from 2003 is opposite in polarity to the FEXT accumulated from 2001-2002, and they cancel each other out. This leaves 0% FEXT accumulated after three FEXT sources. The fourth FEXT source 2004 contributes 40% FEXT, so the total FEXT accumulated at the end of the system is 40%. This is a significant improvement over a system or component which would have seen 100% FEXT if routed in the conventional fashion.

Figure 20B:
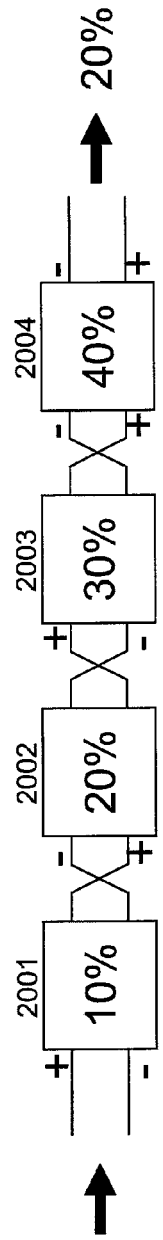
Figure 20C:
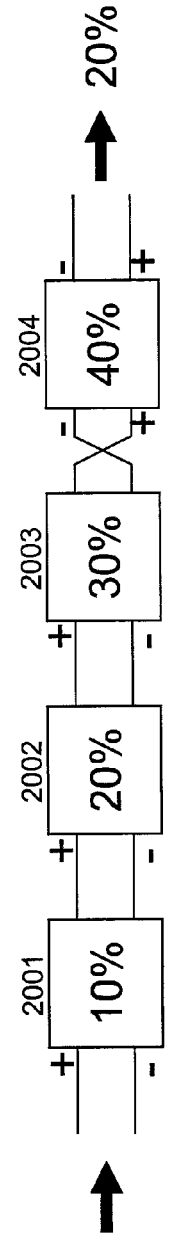

The FEXT in this example can be further reduced to 20% by swapping polarity at different locations as in FIGS. 20*b-c*. FIG. 20*b* shows an example where the polarity is swapped three times: once after 2001, once after 2002, and once after 2003. In this example 40% FEXT of one polarity, accumulated from 2001 and 2003, cancels the 60% FEXT of opposite polarity, accumulated from 2002 and 2004, leaving 20% FEXT in the victim pair. FIG. 20*c* has the victim pair swap once between 2003 and 2004. 40% FEXT from 2004 is canceled by 60% FEXT from 2001-2003, resulting in 20% FEXT left over.

Figure 20D:
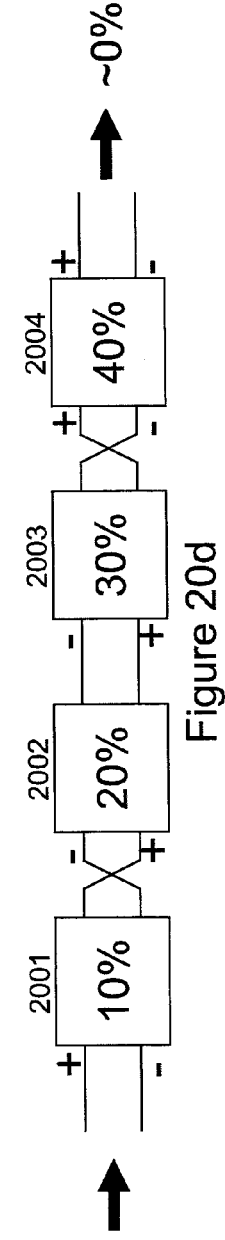

With some optimization, it can be seen that FEXT can be cancelled even further using one or more embodiments of the present invention. FIG. 20*d* shows an example where polarity is swapped between 2001 and 2002 and between 2003 and 2004. 50% FEXT of one polarity is coupled from sources 2001 and 2004, and 50% FEXT of the opposite polarity is couple from sources 2002 and 2003. These FEXT sources cancel each other out and leave a minimal amount of FEXT in the victim pair. To achieve maximum FEXT cancellation, the location or locations of where to swap polarity can be optimized. The examples of FIGS. 20*a-d* have shown four different examples of how utilizing one or more embodiments of the polarity swapping invention can be used to dramatically reduce FEXT.

Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A three piece connector reducing Far End Crosstalk (FEXT), comprising:
    a first receptacle on a transmission end;
    a second receptacle on a receiving end;
    an interposer detachably connected to the first receptacle and to the second receptacle; and
    multiple differential pairs connected to the first receptacle and second receptacle; each differential pair comprising a positive signal line and a negative signal line wherein the positive signal line and the negative signal line of each of the multiple differential pairs are disposed at relative physical locations to each other;
    wherein polarity reversal is achieved by intersecting the positive signal line and the negative signal line of each differential pair undergoing polarity reversal only once within the interposer;
    wherein the interposer further comprises a wafer, the multiple differential pairs being disposed on the wafer, and wherein the polarity reversal occurs on the wafer;
    wherein multiple first ones of the multiple differential pairs undergo polarity reversal and multiple second ones of the multiple differential pairs do not undergo the polarity reversal,
    wherein each of the multiple first ones of the multiple differential pairs is placed adjacent to at least one of the multiple second ones of the multiple differential pairs not undergoing polarity reversal, such that every other one of the multiple differential pairs undergoes polarity reversal.

2. The connector of claim 1, wherein the multiple differential pairs are arranged in a staggered array configuration with respect to each wafer in the interposer.

3. The connector of claim 1, wherein delay is adjusted in at least one differential pair such that skew is reduced.

4. The connector of claim 1, wherein the polarity reversal is achieved at at least one predetermined point optimized to achieve maximum FEXT cancellation.

5. The connector according to claim 1, wherein the positive signal line and the negative signal line of each of said multiple differential pairs do not intersect any positive signal lines and negative signal lines of other ones of the multiple differential pairs.

6. The connector of claim 1, wherein the positive signal line and the negative signal line of each said differential pair undergoing polarity reversal are oriented so that said positive signal line and said negative signal line do not intersect any positive signal lines and negative signal lines of other ones of the multiple differential pairs.

7. The connector according to claim 1, wherein the first receptacle and the second receptacle are substantially equal FEXT sources and wherein the intersecting of physical locations occurs substantially at a middle portion of said wafer.

8. The connector of claim 1, wherein the first receptacle and the second receptacle each comprise pin assignments for connecting to a printed circuit board.

9. The connector of claim 1, wherein the center one of the multiple differential pairs undergoes polarity reversal, and wherein the multiple differential pairs undergoing polarity reversal and the multiple differential pairs not undergoing polarity reversal are alternately positioned with respect to the center one of the multiple differential pairs.

10. The connector of claim 1, wherein the center one of the multiple differential pairs does not undergo polarity reversal, and wherein the multiple differential pairs undergoing polarity reversal and the multiple differential pairs not undergoing polarity reversal are alternately positioned with respect to the center one of the multiple differential pairs.

11. The connector of claim 1, wherein the positive signal line and the negative signal line are positioned on different planes with respect to a z-axis at the intersection.

12. A three piece connector reducing Far End Crosstalk (FEXT), comprising:
    a first receptacle on a transmission end;
    a second receptacle on a receiving end;
    an interposer detachably connected to the first receptacle and to the second receptacle;
    at least one single ended signal line; and
    multiple differential pairs connected to the first receptacle and the second receptacle; each differential pair comprising a positive signal line and a negative signal line;
    wherein the positive signal line and the negative signal line of each of the multiple differential pairs are disposed at relative physical locations to each other;

wherein the interposer further comprises a wafer, the multiple differential pairs being disposed on the wafer, and wherein the polarity reversal occurs on the wafer;

wherein polarity reversal is achieved by intersecting the positive signal line and the negative signal line of each differential pair undergoing polarity reversal only once within the interposer;

wherein multiple first ones of the multiple differential pairs undergo polarity reversal and multiple second ones of the multiple differential pairs do not undergo the polarity reversal, wherein each of the multiple first ones of the multiple differential pairs is placed adjacent to at least one of the multiple second ones of the multiple differential pairs not undergoing polarity reversal, such that every other one of the multiple differential pairs undergoes polarity reversal.

13. The connector of claim 12, wherein delay is adjusted in one of the at least one differential pair or in the at least one single-ended signal line such that skew is reduced.

14. The connector of claim 12, wherein the polarity reversal is achieved at at least one predetermined point optimized to achieve maximum FEXT cancellation.

15. The connector according to claim 12, wherein the positive signal line and the negative signal line of each of said multiple differential pairs do not intersect any positive signal lines and negative signal lines of other ones of the multiple differential pairs.

16. The connector of claim 12, wherein the positive signal line and the negative signal line of each said differential pair undergoing polarity reversal are oriented so that said positive signal line and said negative signal line do not intersect any positive signal lines and negative signal lines of other ones of the multiple differential pairs.

17. The connector according to claim 12, wherein the first receptacle and the second receptacle are substantially equal FEXT sources and wherein the intersecting of physical locations occurs substantially at a middle portion of said wafer.

18. The connector of claim 12, wherein the positive signal line and the negative signal line are positioned on different planes with respect to a z-axis at the intersection.

* * * * *